US012068295B2

(12) United States Patent
Yu et al.

(10) Patent No.: US 12,068,295 B2
(45) Date of Patent: Aug. 20, 2024

(54) DEEP PARTITION POWER DELIVERY WITH DEEP TRENCH CAPACITOR

(71) Applicant: Taiwan Semiconductor Manufacturing Co., Ltd., Hsinchu (TW)

(72) Inventors: Chen-Hua Yu, Hsinchu (TW); Chung-Hao Tsai, Huatan Township (TW); Chuei-Tang Wang, Taichung (TW); Chieh-Yen Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/356,808

(22) Filed: Jul. 21, 2023

(65) Prior Publication Data

US 2023/0369302 A1 Nov. 16, 2023

Related U.S. Application Data

(63) Continuation of application No. 17/232,325, filed on Apr. 16, 2021, now Pat. No. 11,784,172.
(Continued)

(51) Int. Cl.
*H01L 25/16* (2023.01)
*H01L 21/304* (2006.01)
(Continued)

(52) U.S. Cl.
CPC ............ *H01L 25/16* (2013.01); *H01L 21/304* (2013.01); *H01L 21/6835* (2013.01);
(Continued)

(58) Field of Classification Search
CPC ... H01L 25/16; H01L 21/304; H01L 21/6835; H01L 21/76898; H01L 23/481;
(Continued)

(56) References Cited

U.S. PATENT DOCUMENTS 9,553,065 B2 * 1/2017 Lin ..................... H01L 23/3114
10,741,512 B2 8/2020 Wu et al.
(Continued)

FOREIGN PATENT DOCUMENTS

CN 111199954 A 5/2020
CN 113053855 A * 6/2021 ....... H01L 21/76895
(Continued)

OTHER PUBLICATIONS

Bunel, C., et al., Integrated Passive Devices and TSV, a distruptive technology for miniaturization., 48th International Sumposium on Microelectronics, IMAPS, Orlando, Florida, Sep. 30-Oct. 3, 2013, 5 pages.

*Primary Examiner* — Mamadou L Diallo
(74) *Attorney, Agent, or Firm* — Slater Matsil, LLP

(57) ABSTRACT

A method includes bonding a capacitor die to a device die. The device die includes a first semiconductor substrate, active devices at a surface of the first semiconductor substrate, a plurality of low-k dielectric layers, a first dielectric layer over and contacting a top low-k dielectric layer in the plurality of low-k dielectric layers, and a first plurality of bond pads in the first dielectric layer. The capacitor die includes a second dielectric layer bonding to the first dielectric layer, a second plurality of bond pads in the second dielectric layer and bonding to the first plurality of bond pads, and a capacitor electrically coupled to the second plurality of bond pads. After the capacitor die is bonded to the device die, an aluminum-containing pad is formed over the capacitor die and electrically coupled to the device die. A polymer layer is formed over the aluminum-containing pad.

20 Claims, 29 Drawing Sheets

Related U.S. Application Data

(60) Provisional application No. 63/148,650, filed on Feb. 12, 2021.

(51) Int. Cl.
*H01L 21/683* (2006.01)
*H01L 21/768* (2006.01)
*H01L 23/00* (2006.01)
*H01L 23/48* (2006.01)

(52) U.S. Cl.
CPC ...... *H01L 21/76898* (2013.01); *H01L 23/481* (2013.01); *H01L 24/05* (2013.01); *H01L 24/08* (2013.01); *H01L 24/80* (2013.01); *H01L 2221/68327* (2013.01); *H01L 2224/05124* (2013.01); *H01L 2224/08145* (2013.01); *H01L 2224/80006* (2013.01); *H01L 2224/80895* (2013.01); *H01L 2224/80896* (2013.01); *H01L 2924/1205* (2013.01); *H01L 2924/1434* (2013.01)

(58) Field of Classification Search
CPC ......... H01L 24/05; H01L 24/08; H01L 24/80; H01L 2221/68327; H01L 2224/05124; H01L 2224/08145; H01L 2224/80006; H01L 2224/80895; H01L 2224/80896; H01L 2924/1205; H01L 2924/1434; H01L 23/5223; H01L 2924/19041
See application file for complete search history.

(56) References Cited

U.S. PATENT DOCUMENTS

| | | | |
|---|---|---|---|
| 2008/0038874 A1* | 2/2008 | Lin | H01L 23/293 438/118 |
| 2014/0070292 A1* | 3/2014 | Cheng | H10B 12/37 438/389 |
| 2016/0218071 A1* | 7/2016 | Nam | G06F 21/86 |
| 2019/0148342 A1* | 5/2019 | Hu | H01L 25/105 257/659 |
| 2020/0152608 A1* | 5/2020 | Hu | H01L 23/5389 |
| 2020/0402951 A1* | 12/2020 | Chen | H01L 24/03 |
| 2021/0167007 A1* | 6/2021 | Chung | H01L 24/02 |
| 2021/0280540 A1* | 9/2021 | Kim | H01L 25/105 |
| 2021/0398943 A9* | 12/2021 | Chen | H01L 21/4814 |
| 2021/0407942 A1* | 12/2021 | Yu | H01L 25/03 |
| 2022/0102267 A1 | 3/2022 | Chen et al. | |
| 2022/0165721 A1* | 5/2022 | Lee | H01L 25/50 |
| 2022/0359410 A1* | 11/2022 | Jeng | H01L 21/6835 |

FOREIGN PATENT DOCUMENTS

| | | |
|---|---|---|
| CN | 113053855 A | 6/2021 |
| DE | 102017117815 A1 | 3/2018 |
| DE | 102018124695 A1 | 5/2019 |
| KR | 20190055770 A | 5/2019 |

\* cited by examiner

DEEP PARTITION POWER DELIVERY WITH DEEP TRENCH CAPACITOR

PRIORITY CLAIM AND CROSS-REFERENCE

This application is a continuation of U.S. patent application Ser. No. 17/232,325 entitled "Deep Partition Power Delivery with Deep Trench Capacitor" filed on Apr. 16, 2021, which claims the benefit of the following provisionally filed U.S. patent application: Application No. 63/148,650, filed on Feb. 12, 2021, and entitled "Deep Partition Power Delivery with Deep Trench Capacitor," which application is hereby incorporated herein by reference.

BACKGROUND

High-Performance logic circuits often need high density capacitors to reduce simultaneous switching noise and to reduce voltage drop. The density of the presently used capacitors is often low, and cannot fulfill the requirement of power integrity of high-performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
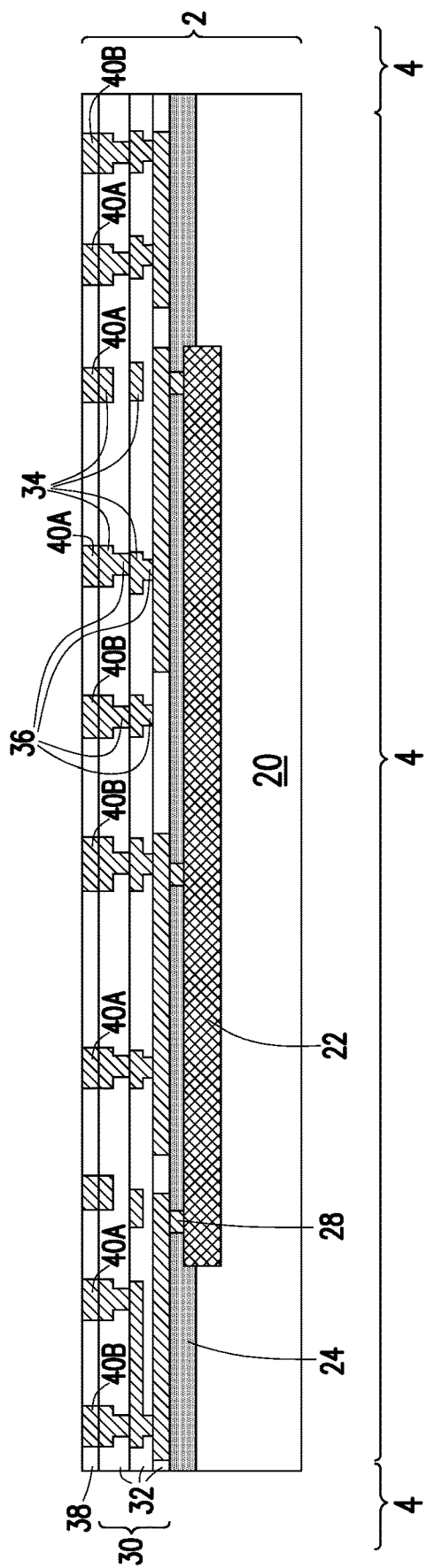
FIGS. 1-12 illustrate the cross-sectional views of intermediate stages in the formation of a package having deep partition capacitors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package having deep partition capacitors and the method of forming the same are provided. In accordance with some embodiments of the present disclosure, a high-density capacitor, which may be a deep trench capacitor, is formed on a package component such as a die, which may or may not include a substrate. The capacitor-containing package component is bonded directly to lower redistribution layers of a device die, which may be a logic die, so that the high-density capacitor can be accessed by the device die. The upper layers of the device die are formed after the bonding and over the capacitor die. The high-density capacitor may be used by the power-delivery network in the device die. With this design, very high capacitor density may be achieved without interfere the design of the logic die. Also, since the capacitor die is equivalent to be inserted between the lower layers and the upper layers of the device die, the capacitors in the capacitor die have short paths to the devices in the device die. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 29:
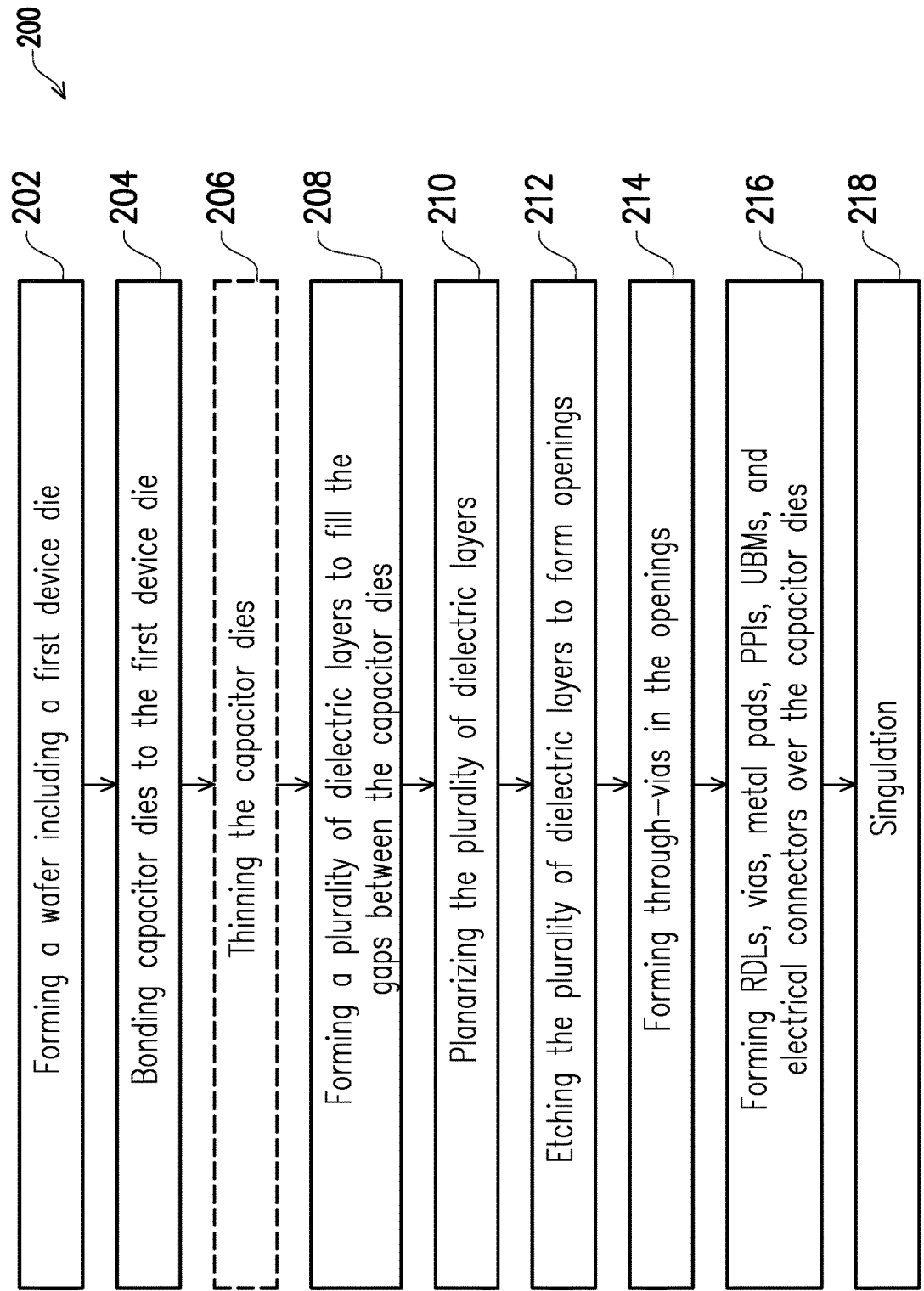
FIG. 29 illustrates a process flow for forming a package having deep partition capacitors in accordance with some embodiments.

FIGS. 1 through 12 illustrate the cross-sectional views of intermediate stages in the formation of a package having deep partition capacitors in accordance with some embodiments of the present disclosure. The corresponding processes are also reflected schematically in the process flow 200 as shown in FIG. 29.

FIG. 1 illustrates the cross-sectional view in the formation of wafer 2. The respective process is illustrated as process 202 in the process flow shown in FIG. 29. In accordance with some embodiments of the present disclosure, wafer 2 is a device wafer including active devices such as transistors and/or diodes, and possibly passive devices such as capacitors, inductors, resistors, or the like. Device wafer 2 may include a plurality of chips 4 therein, with one of chips 4 illustrated. Chips 4 are alternatively referred to as (device) dies hereinafter. In accordance with some embodiments of the present disclosure, device die 4 is a logic die, which may be a Central Processing Unit (CPU) die, a Graphics Processing Unit (GPU), an Xtreme Processing Unit (XPU), a Micro Control Unit (MCU) die, a BaseBand (BB) die, an Application processor (AP) die, or the like.

In accordance with some embodiments of the present disclosure, the example wafer 2 includes semiconductor substrate 20 and the features formed at a top surface of semiconductor substrate 20. Semiconductor substrate 20 may be formed of crystalline silicon, crystalline germanium, crystalline silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, wherein the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Example integrated circuit devices 22 may include Complementary Metal-Oxide Semiconductor (CMOS) transistors, resistors, capacitors, diodes, and/or the like. The details of integrated circuit devices 22 are not illustrated herein. In accordance with alternative embodiments, wafer 2 is used for forming interposers, in which substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some example embodiments, ILD 24 is formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like. ILD 24 may be formed using spin coating, Flowable Chemical Vapor Deposition (FCVD), Chemical Vapor Deposition (CVD), or the like. In accordance with some embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines and vias. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP) process) to level the top surfaces of contact plugs 28 with the top surface of ILD 24.

Over ILD 24 and contact plugs 28 resides interconnect structure 30. Interconnect structure 30 includes metal lines 34 and vias 36, which are formed in dielectric layers 32. Dielectric layers 32 are alternatively referred to as Inter-Metal Dielectric (IMD) layers 32 hereinafter. In accordance with some embodiments of the present disclosure, at least some or all of dielectric layers 32 are formed of a low-k dielectric material having a dielectric constant (k-value) lower than about 3.0, about 2.5, or even lower. Dielectric layers 32 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 32 are formed of non-low-k dielectric materials such as silicon oxide, silicon carbide (SiC), silicon carbo-nitride (SiCN), silicon oxy-carbo-nitride (SiOCN), or the like. In accordance with some embodiments of the present disclosure, the formation of dielectric layers 32 includes depositing a porogen-containing dielectric material, and then performing a curing process to drive out the porogen, and hence the remaining dielectric layers 32 is porous. Etch stop layers (not shown), which may be formed of silicon carbide, silicon nitride, or the like, are formed between IMD layers 32, and are not shown for simplicity.

Metal lines 34 and vias 36 are formed in dielectric layers 32. The metal lines 34 at a same level are collectively referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. The formation process may include single damascene and dual damascene processes. In an example single damascene process, a trench is first formed in one of dielectric layers 32, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Metal lines 34 and vias 36 may include a Power Delivery Network (PDN) and signal delivery network. The power delivery network may include power planes, which are large metal plates for delivering VDD and VSS, and to reduce voltage drop. The power delivery network may be connected to the high-density capacitors 49 in the subsequently bonded capacitor die 42 (FIG. 12) to reduce simultaneous switching noise (SSN) and to reduce voltage drop.

FIG. 1 further illustrates surface dielectric layer 38 in accordance with some embodiments of the present disclosure. Surface dielectric layer 38 may be formed of a non-low-k dielectric material such as silicon oxide, and may be in physical contact with the underlying low-k dielectric layer 32 in accordance with some embodiments. Surface dielectric layer 38 is alternatively referred to as a passivation layer since it has the function of isolating the underlying low-k dielectric layers (if any) from the adverse effect of detrimental chemicals and moisture. Surface dielectric layer 38 may have a single-layer structure or a composite structure including more than one layer, which may be formed of silicon oxide, silicon nitride, Undoped Silicate Glass (USG), or the like. Device die 4 may be free from aluminum-containing pads and organic materials such as polymers therein.

Bond pads 40A and 40B, which are also collectively or individually referred to bond pads 40, are formed in surface dielectric layer 38. In accordance with some embodiments of the present disclosure, bond pads 40A and 40B are formed through a single damascene process, and may also include barrier layers and a copper-containing material formed over the barrier layers. In accordance with alternative embodiments of the present disclosure, bond pads 40A and 40B may be formed through a dual damascene process. The surface dielectric layer 38 and bond pads 40 are planarized so that their top surfaces are coplanar, which may be resulted due to the CMP in the formation of bond pads 40.

Figure 2:
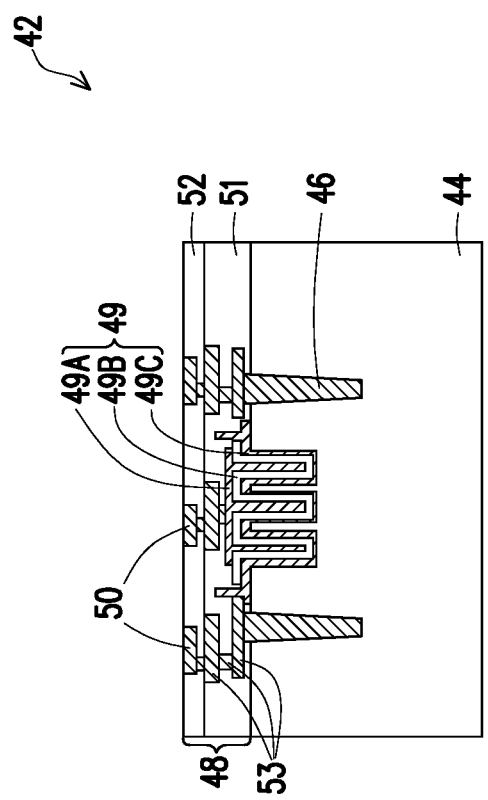

FIG. 2 illustrates a cross-sectional view of capacitor die 42, which includes capacitor 49 therein. In accordance with some embodiments, capacitor die 42 includes semiconductor substrate 44, which may be a silicon substrate, or may be formed of other semiconductor materials. Through-Silicon Vias (TSVs) 46, sometimes referred to as through-semiconductor vias or through-vias, are formed to extend into semiconductor substrate 44. Also, capacitor die 42 includes interconnect structure 48 for connecting the metal lines and deep trench capacitors 49 in capacitor die 42 to bond pads 50. Interconnect structure 48 include dielectric layers 51 and metal lines and vias 53. The metal lines and vias 53 and bond pads 50 may be formed using damascene processes.

Capacitor 49 may include capacitor electrodes 49A and 49C, and capacitor insulator 49B between capacitor electrodes 49A and 49C. Electrodes 49A and 49C and capacitor insulator 49B may extend into substrate 44, so that capacitor 49 may be a deep trench capacitor, and the capacitance density (capacitance per unit area) is high. Also, there may be a plurality of capacitor insulators, which are located between a plurality of capacitor insulators to form a plurality of sub capacitors. The sub capacitors are connected in parallel to form an integrated capacitor. In accordance with some embodiments, the capacitance density in capacitor die 42 may be greater than about 100 $nF/mm^2$, greater than about 500 $nF/mm^2$, or greater than about 1,000 $nF/mm^2$, and may be between about 250 $nF/mm^2$ and about 5,000 $nF/mm^2$. Greater capacitance density values are beneficial for forming capacitors having great capacitance values, which are required by some applications.

Capacitor die 42 includes bond pads 50 and dielectric layer 52 at the illustrated top surface of capacitor die 42. The top surfaces of bond pads 50 are substantially coplanar with the top surface of dielectric layer 52. In accordance with some embodiments of the present disclosure, capacitor die 42 is free from active devices such as transistors and diodes. In accordance with some embodiments, each of capacitors 49 has two terminals, each connecting to one of the bond pads 50.

Figure 3:
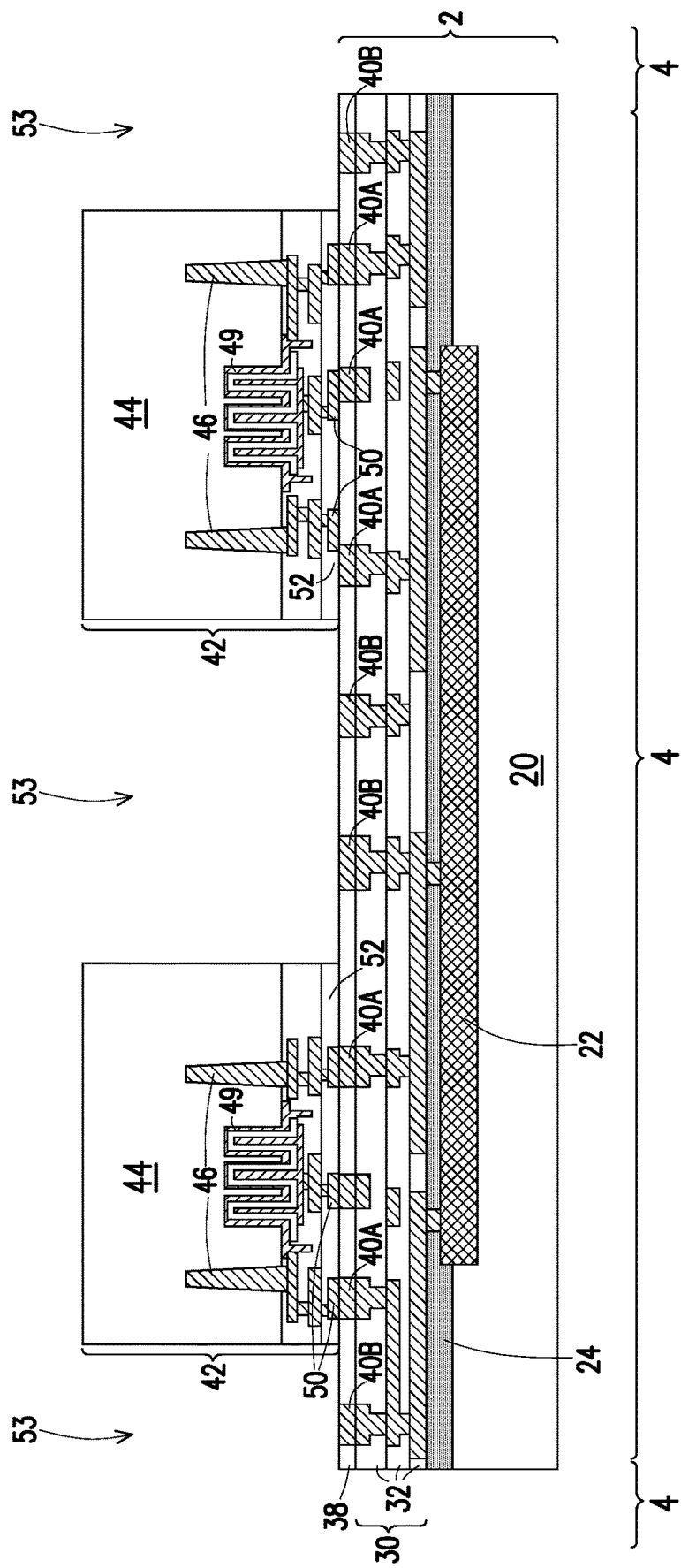

Next, a plurality of capacitor dies 42 are bonded to wafer 2, as shown in FIG. 3. The respective process is illustrated as process 204 in the process flow shown in FIG. 29. The bonding may be achieved through hybrid bonding. For example, bond pads 50 are bonded to bond pads 40A through metal-to-metal direct bonding. In accordance with some embodiments of the present disclosure, the metal-to-metal direct bonding is copper-to-copper direct bonding. Furthermore, dielectric layers 52 are bonded to surface dielectric layer 38 through fusion bonding, for example, with Si—O—Si bonds generated.

To achieve the hybrid bonding, capacitor dies 42 are first pre-bonded to dielectric layer 38 and bond pads 40A by lightly pressing capacitor dies 42 against die 4. Although two capacitor dies 42 are illustrated, the hybrid bonding may be performed at wafer level, and a plurality of device die groups identical to the illustrated die group including capacitor dies 42 is pre-bonded, and arranged as rows and columns.

After all capacitor dies 42 are pre-bonded, an annealing process is performed to cause the inter-diffusion of the metals in bond pads 40A and the corresponding overlying bond pads 50. The annealing temperature may be in the range between about 200° and about 400° C., and may be in the range between about 300° and about 400° C. in accordance with some embodiments. The annealing time may be in the range between about 1.5 hours and about 3.0 hours, and may be in the range between about 1.5 hours and about 2.5 hours in accordance with some embodiments.

Dielectric layer 38 is also bonded to dielectric layers 52, with bonds formed therebetween. For example, the atoms (such as oxygen atoms) in one of the dielectric layers 38 and 52 form chemical or covalence bonds with the atoms (such as silicon atoms) in the other one of dielectric layers 38 and 52. The resulting bonds between dielectric layers 38 and 52 are dielectric-to-dielectric bonds, and may be fusion bonds. Gaps 53 are left between neighboring capacitor dies 42.

Figure 4:
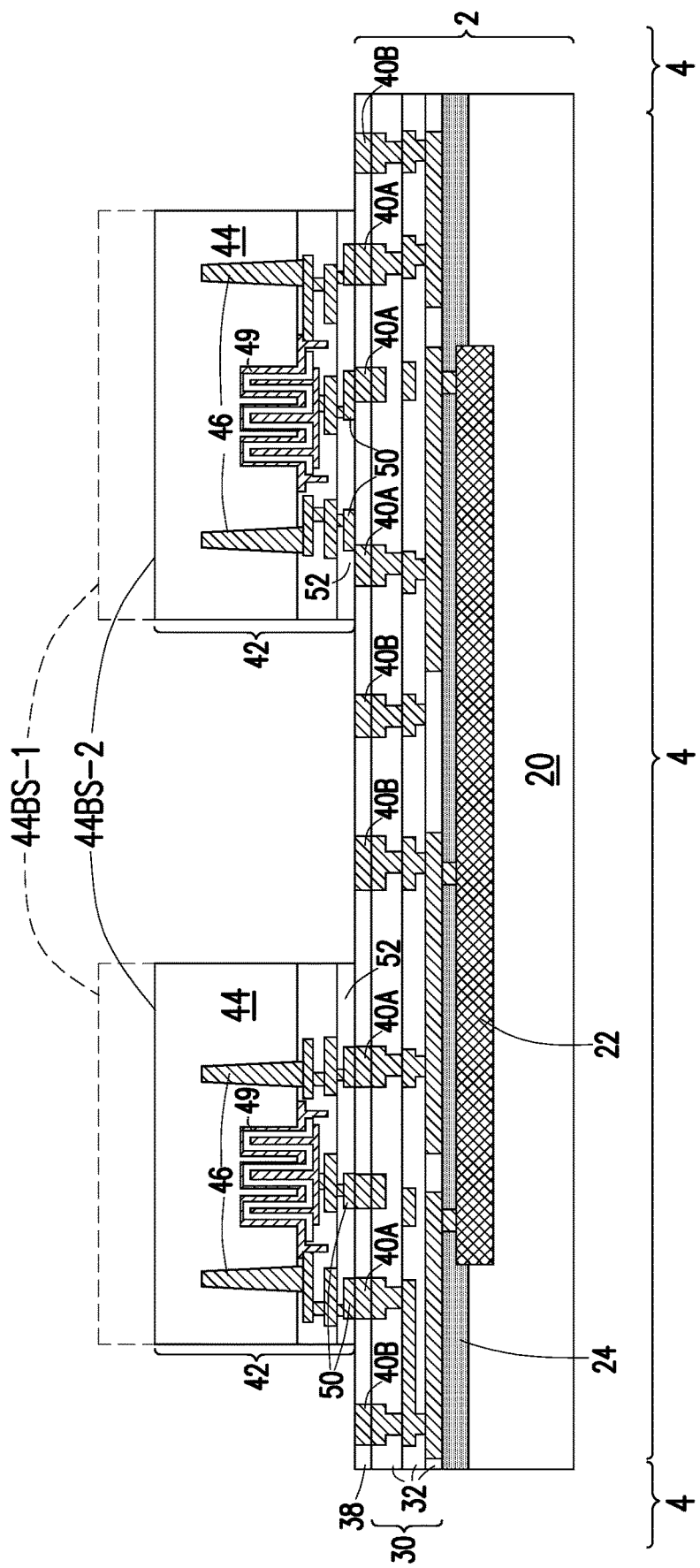

Referring to FIG. 4, a backside grinding process may be performed to thin capacitor dies 42. The respective process is illustrated as process 206 in the process flow shown in FIG. 29. This process may also be skipped, and accordingly, the process 206 in FIG. 29 is shown as being dashed to represent that this process may be or may not be performed. FIG. 4 schematically illustrates dashed lines 44-BS1 and 44-BS2, which are the back surfaces of capacitor dies 42 before and after, respectively, the backside grinding process. Through the thinning of capacitor dies 42, the aspect ratio of gaps 53 between neighboring capacitor dies 42 is reduced in order to perform gap filling. Otherwise, the gap filling may be difficult due to the otherwise high aspect ratio of gaps 53. In accordance with some embodiments, after the backside grinding, TSVs 46 are not revealed, and the backside grinding is stopped when there is a thin layer of substrate covering TSVs 46. In accordance with alternatively embodiments, TSVs 46 are revealed after the grinding.

Figure 5:
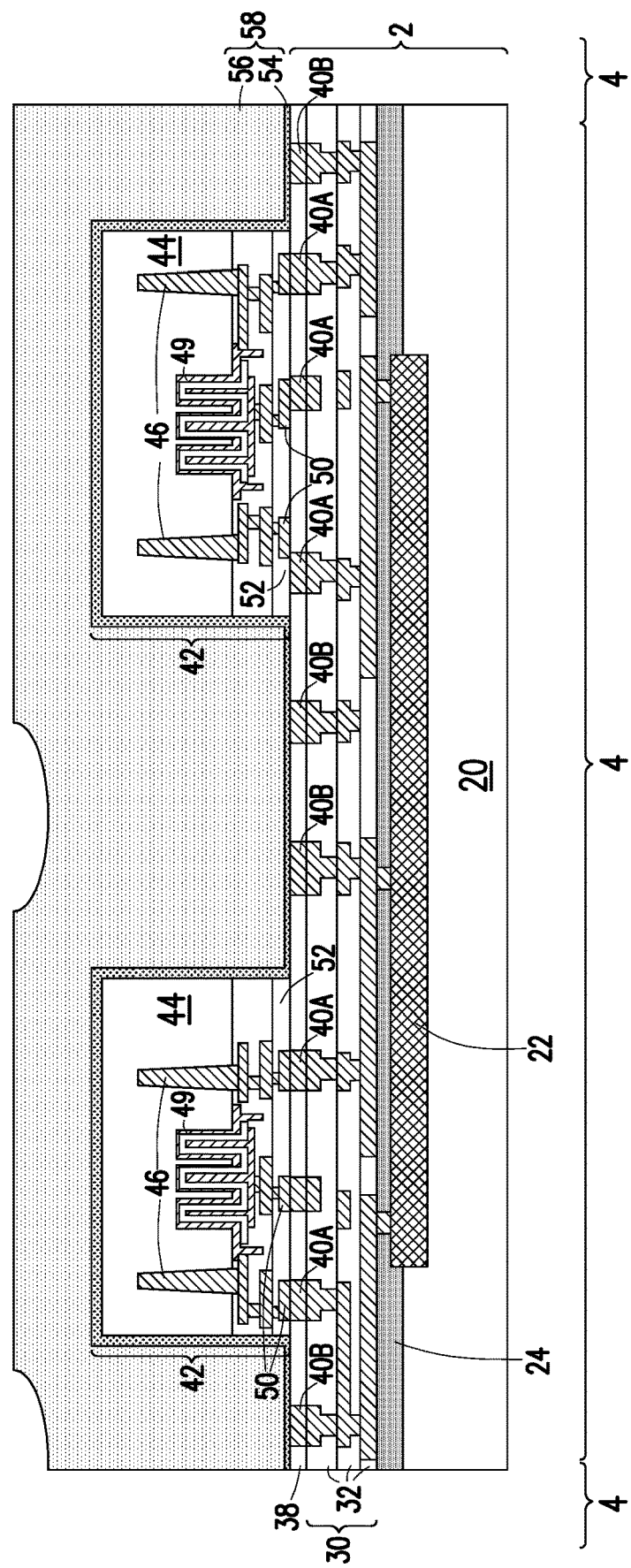

FIG. 5 illustrates the formation of gap-filling layers. The respective process is illustrated as process 208 in the process flow shown in FIG. 29. In accordance with some embodiments of the present disclosure, the gap-filling layers includes etch stop layer 54, and dielectric layer 56 over and contacting etch stop layer 54. Etch stop layer 54 may be deposited using a conformal deposition process such as Atomic Layer Deposition (ALD) or Chemical Vapor Deposition (CVD). Accordingly, etch stop layer 54 may be a conformal layer, for example, with the thickness of the horizontal portions and thickness of the vertical portions being substantially equal to each other, for example, with a variation smaller than about 20 percent. Etch stop layer 54 is formed of a dielectric material that has good adhesion to the sidewalls of capacitor dies 42 and the top surfaces of dielectric layer 38 and bond pads 40B. In accordance with some embodiments of the present disclosure, etch stop layer 54 is formed of or comprises a nitride-containing material such as silicon nitride.

Dielectric layer 56 is formed of a material different from the material of etch stop layer 54. In accordance with some embodiments of the present disclosure, dielectric layer 56 is formed of or comprises silicon oxide, while other dielectric materials such as silicon carbide, silicon oxynitride, silicon oxy-carbo-nitride, or the like may also be used. Dielectric layer 56 may be a conformal layer, with the thicknesses of the horizontal portions and vertical portions being substantially equal to each other, or may be a non-conformal layer.

Figure 6:
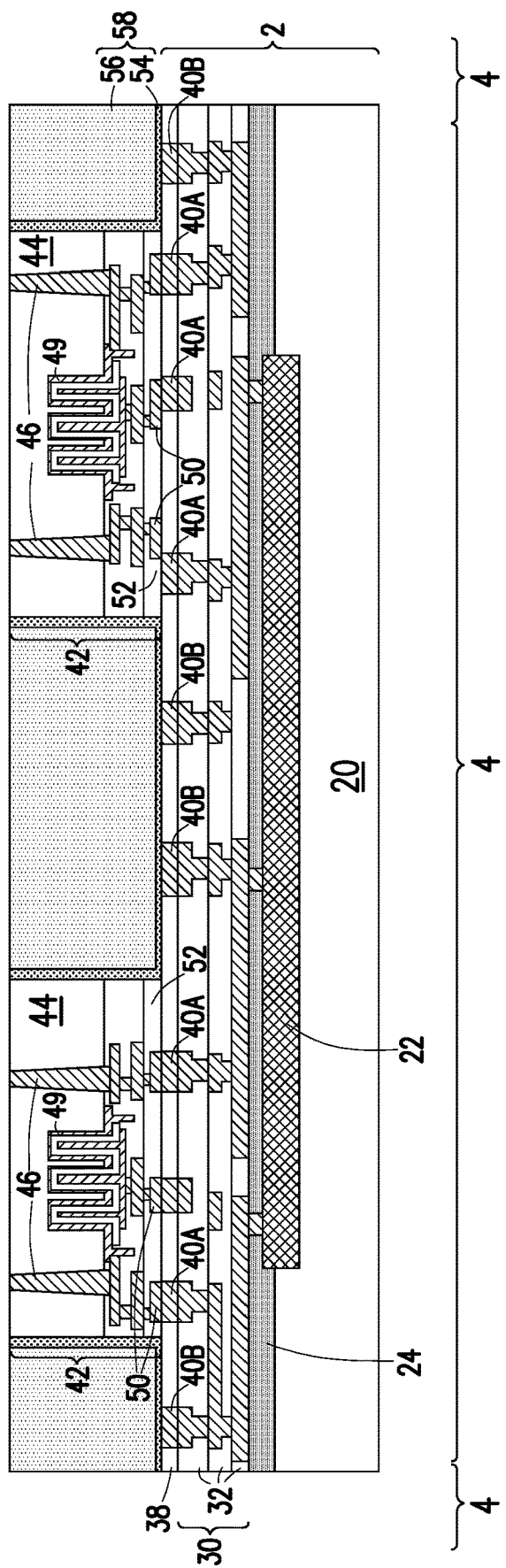

Referring to FIG. 6, a planarization process such as a CMP process or a mechanical grinding process is performed to remove excess portions of gap-filling layers 56 and 54, so that capacitor dies 42 are exposed and then polished. The respective process is illustrated as process 210 in the process flow shown in FIG. 29. Also, through-vias 46 are exposed. The remaining portions of layers 54 and 56 are collectively referred to as (gap-filling) isolation regions 58.

Figure 7:
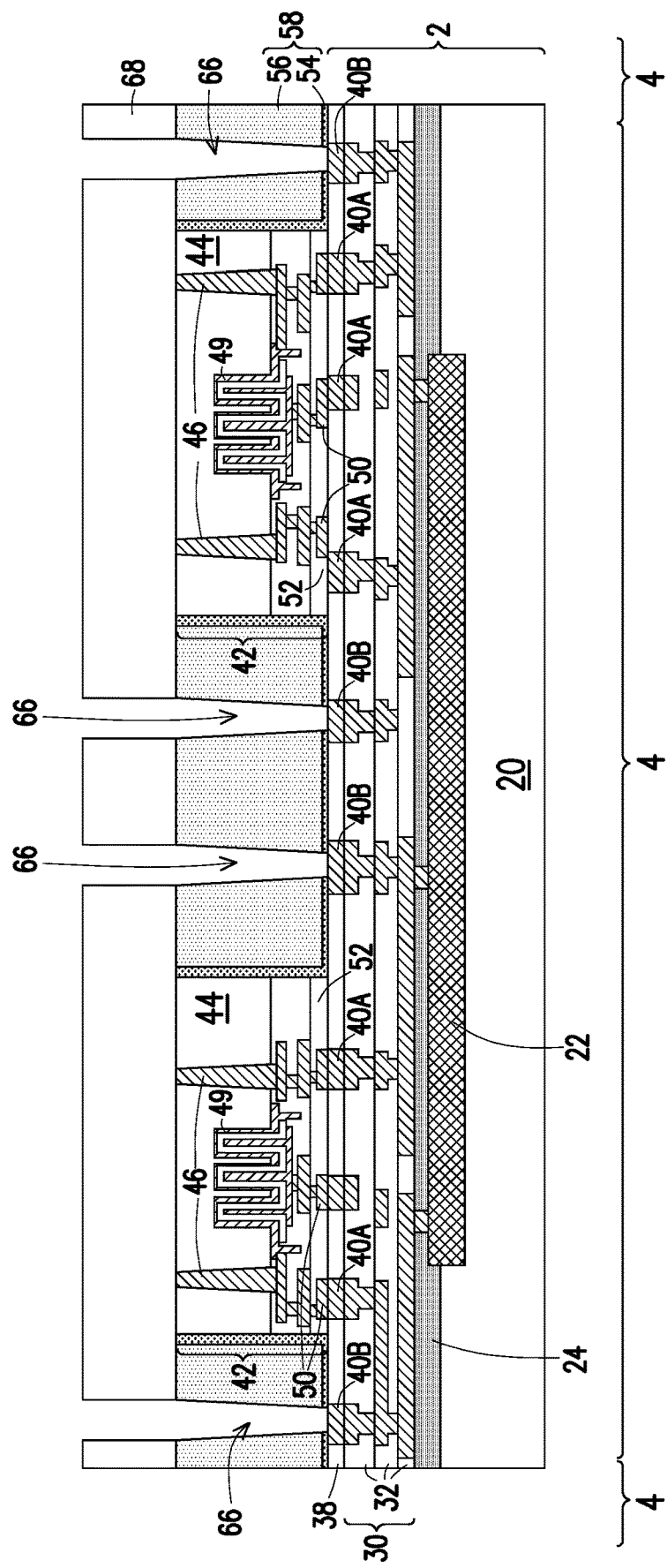

FIG. 7 illustrates the etching of isolation regions 58 to form openings 66. The respective process is illustrated as process 212 in the process flow shown in FIG. 29. In accordance with some embodiments of the present disclosure, photo resist 68 is formed and patterned, and dielectric layer 56 is etched using the patterned photo resist 68 as an etching mask. Openings 66 are thus formed to extend down to etch stop layer 54. Next, etch stop layer 54 is further etched, so that openings 66 extend down to bond pads 40B, which are exposed to openings 66. The etching process may also be a dry etching process or a wet etching process. In accordance with some embodiments of the present disclosure, etch stop layer 54 is formed of silicon nitride, and the etching is performed using dry etching. The etching gas may include a mixture of $CF_4$, $O_2$, and $N_2$, a mixture of $NF_3$ and $O_2$, $SF_6$, or a mixture of $SF_6$ and $O_2$. Photo resist 68 is then removed.

Figure 8:
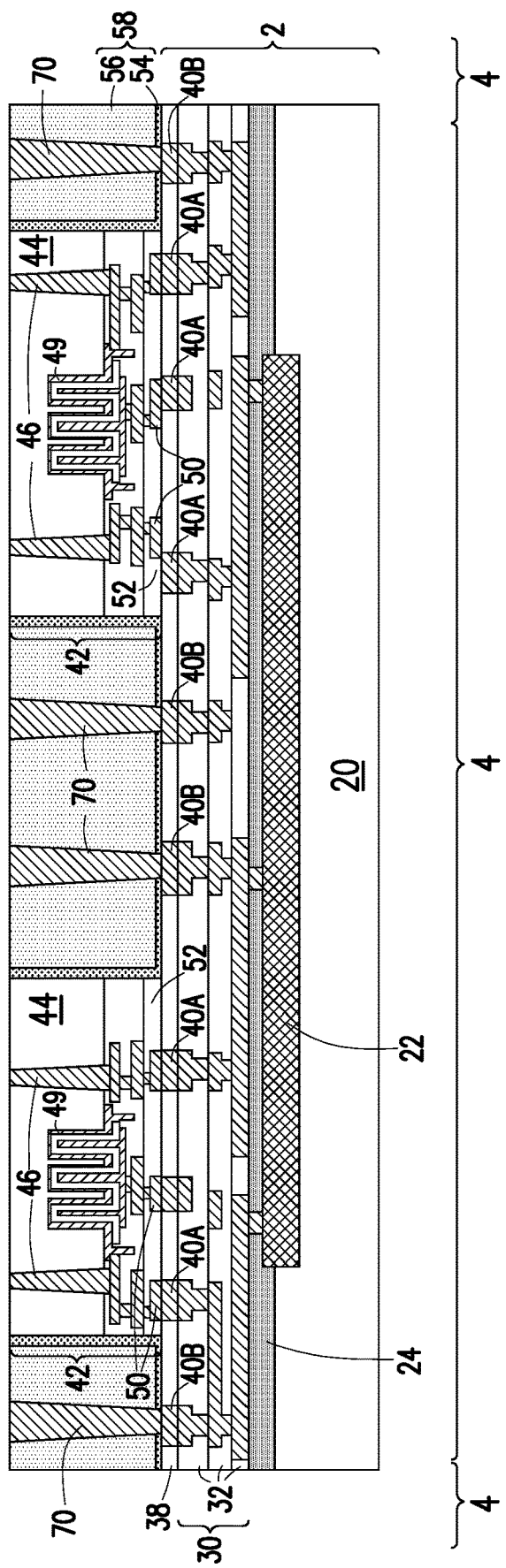

FIG. 8 illustrates the formation of through-vias 70, which fills openings 66 (FIG. 7), and are connected to bond pads 40B. The respective process is illustrated as process 214 in the process flow shown in FIG. 29. In accordance with some embodiments of the present disclosure, the formation of through-vias 70 includes performing a plating process such as an electrical-chemical plating process or an electro-less plating process. Through-vias 70 may include a metallic material such as tungsten, aluminum, copper, or the like. A conductive barrier layer (such as titanium, titanium nitride, tantalum, tantalum nitride, or the like) may also be formed underlying the metallic material. A planarization process such as a CMP process is performed to remove excess portions of the plated metallic material, and the remaining portions of the metallic material form through-vias 70. Through-vias 70 may have substantially straight and vertical sidewalls. Also, through-vias 70 may have a tapered profile, with top widths slightly greater than the respective bottom widths.

As shown in FIG. 8, in accordance with some embodiments in which TSVs 46 are pre-formed before bonding, TSVs 46 may have upper width smaller than the respective bottom widths. Conversely, when TSVs 46 are not pre-formed, for example, after the formation of gap-filling regions 58, capacitor dies 42 may be etched to form additional openings (occupied by the illustrated TSVs 46) either before or after the formation of openings 66. The additional openings in capacitor dies 42 and openings 66 may be filled simultaneously to form TSVs 46 and through-vias 70. The resulting through-vias 46 may have upper portions wider than the respective lower portions.

Figure 9:
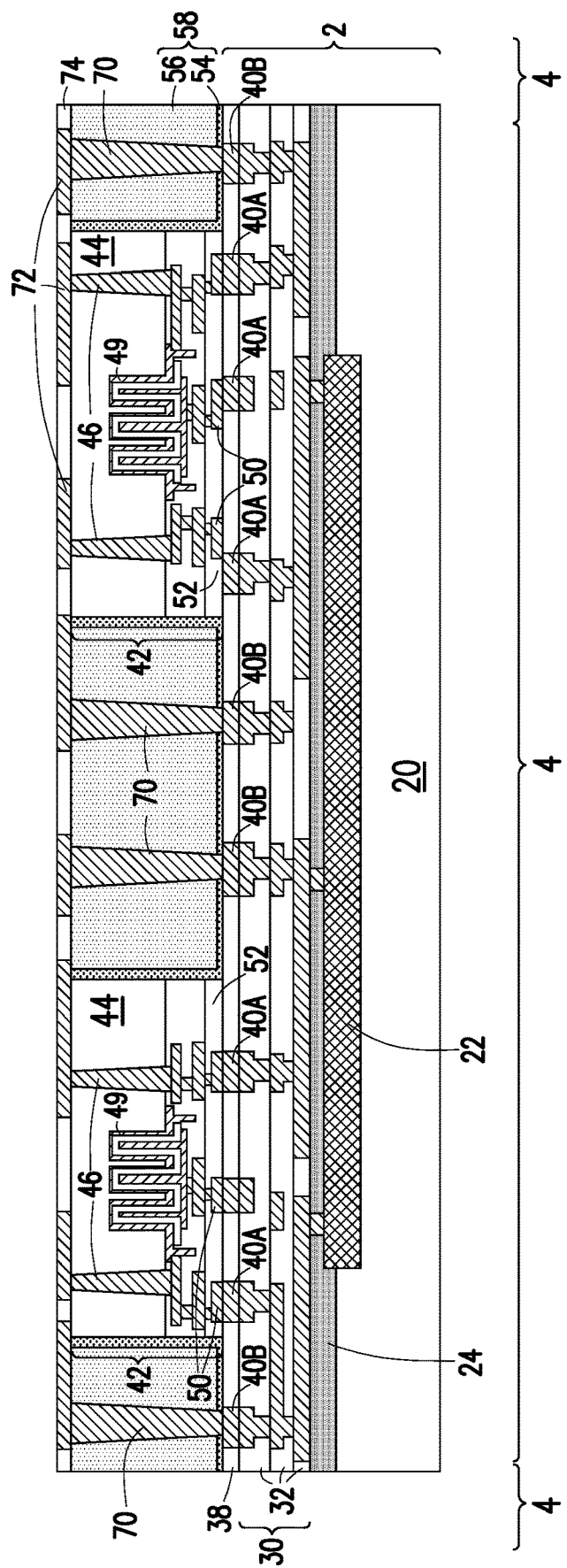

Referring to FIG. 9, backside redistribution lines (RDLs) 72 and dielectric layer 74 are formed. The respective process is illustrated as process 216 in the process flow shown in FIG. 29. In accordance with some embodiments of the present disclosure, dielectric layer 74 is formed of an oxide such as silicon oxide, a nitride such as silicon nitride, or the like, or may be formed of a low-k dielectric material similar to that of dielectric layers 32. RDLs 72 may be formed using a damascene process(s), which includes etching dielectric layer 74 to form openings, depositing a conductive barrier layer into the openings, plating a metallic material such as copper or a copper alloy, and performing a planarization to remove excess portions of RDLs 72. Although one layer of backside RDLs 72 and dielectric layer 74 is illustrated, there may be a plurality of layers of backside RDLs. In accordance with some embodiments of the present disclosure, the entire structure underlying metal pads 80 is free from organic materials (such as polymer layers), so that the process for forming the structures underlying metal pads 80 may adopt damascene processes, and fine-pitches RDLs (such as 72) having small pitches and line widths are made possible. All of the dielectric materials underlying metal pads 80 are inorganic dielectric materials.

Figure 10:
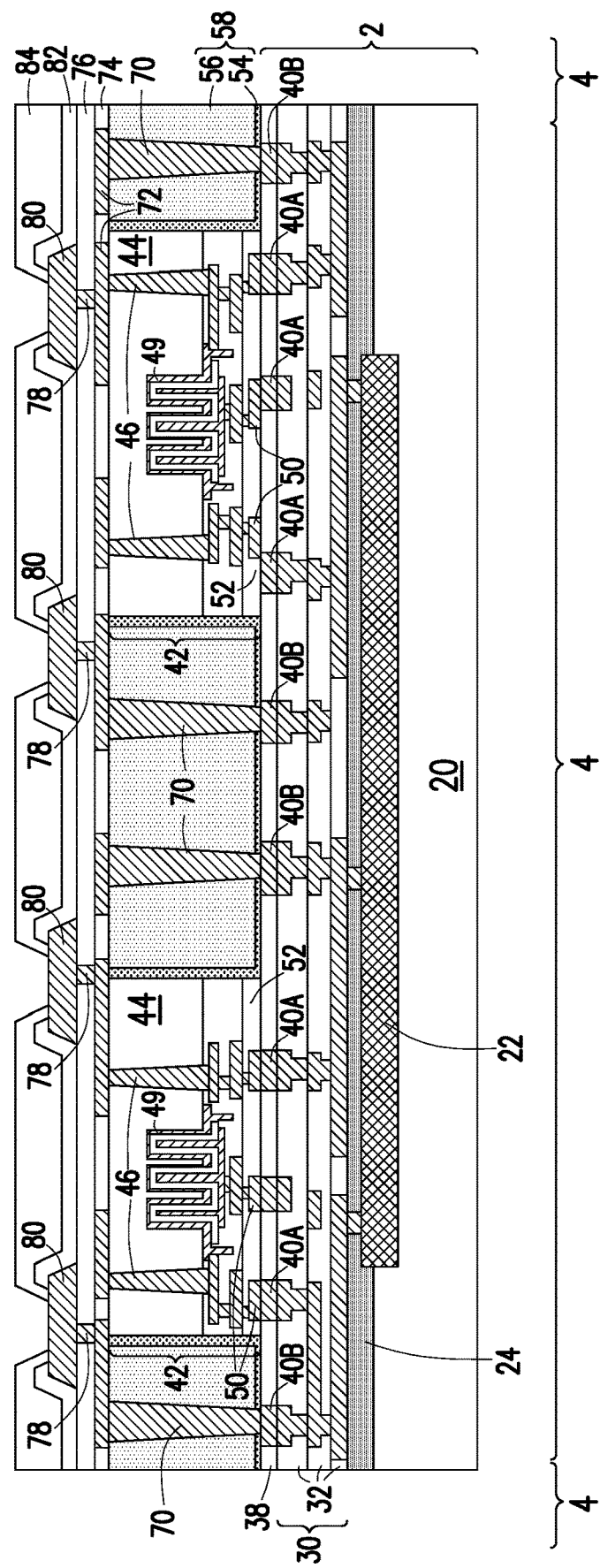

FIG. 10 illustrates the formation of passivation layers, metal pads, and overlying dielectric layers. In accordance with some embodiments, passivation layer 76 (sometimes referred to as passivation-1) is formed over dielectric layer 74, and vias 78 are formed in passivation layer 76 to electrically connect to RDLs 72. Metal pads 80 are formed over passivation layer 76, and are electrically coupled to RDLs 72 through vias 78. The respective process is also illustrated as process 216 in the process flow shown in FIG. 29. Metal pads 80 may be aluminum pads or aluminum-copper pads, while other metallic materials may be used. Metal pads 80 may be formed by depositing a blanket layer, and patterning the blanket layer through etching.

As also shown in FIG. 10, passivation layer 82 (sometimes referred to as passivation-2) is formed over passivation layer 76. Each of passivation layers 76 and 82 may be a single layer or a composite layer, and may be formed of a non-porous material. In accordance with some embodiments of the present disclosure, one or both of passivation layers 76 and 82 is a composite layer including a silicon oxide layer (not shown separately), and a silicon nitride layer (not shown separately) over or under the silicon oxide layer. Passivation layers 76 and 82 may also be formed of other non-porous dielectric materials such as Un-doped Silicate Glass (USG), silicon oxynitride, and/or the like.

Next, passivation layer 82 is patterned, so that some portions of passivation layer 82 cover the edge portions of metal pads 80, and some portions of metal pads 80 are exposed through the openings in passivation layer 82. Polymer layer 84 is then formed, and then patterned to expose metal pads 80. Polymer layer 84 may be formed of polyimide, polybenzoxazole (PBO), or the like.

Figure 11:
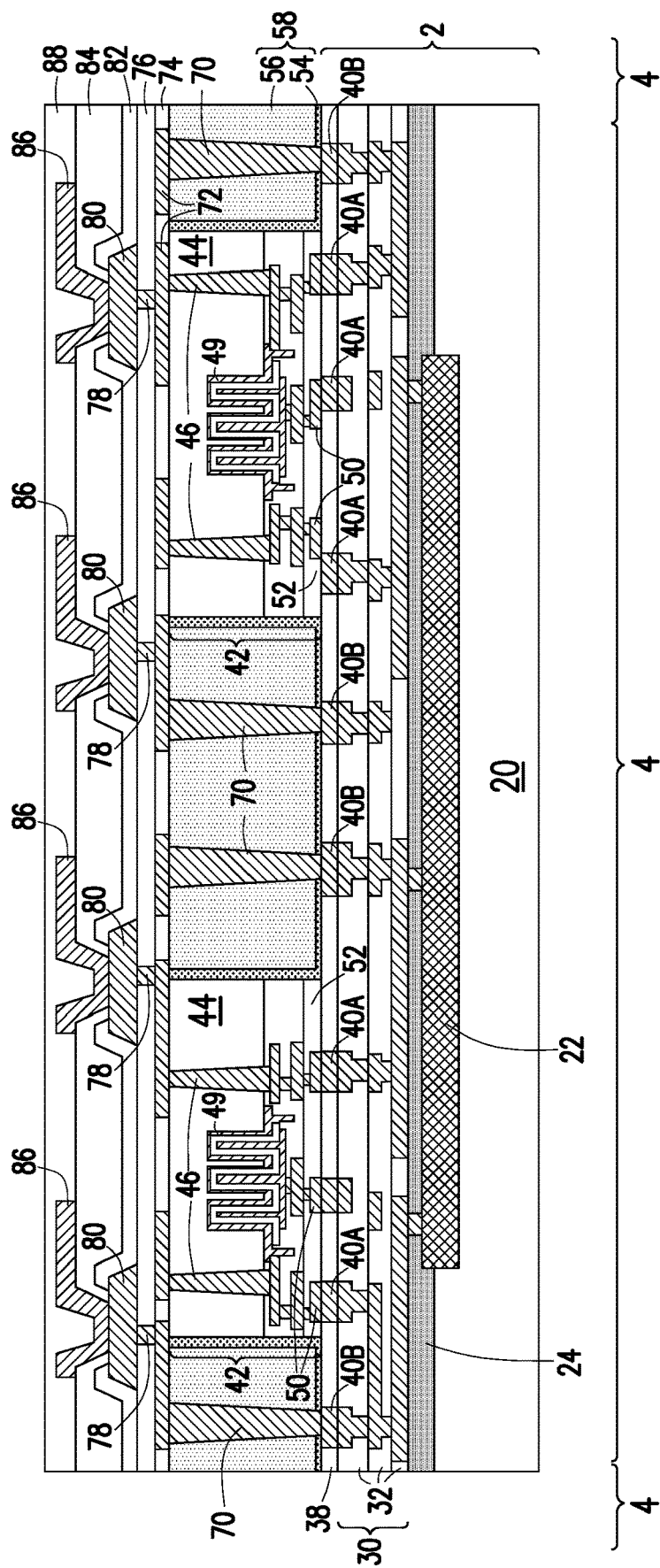

Referring to FIG. 11, Post-Passivation Interconnects (PPI) 86 are formed, which may include forming a metal seed layer and a patterned mask layer (not shown) over the metal seed layer, and plating PPIs 86 in the patterned mask layer. The patterned mask layer and the portions of the metal seed layer overlapped by the patterned mask layer are then removed in etching processes. Polymer layer 88 is then formed, which may be formed of PBO, polyimide, or the like.

Figure 12:
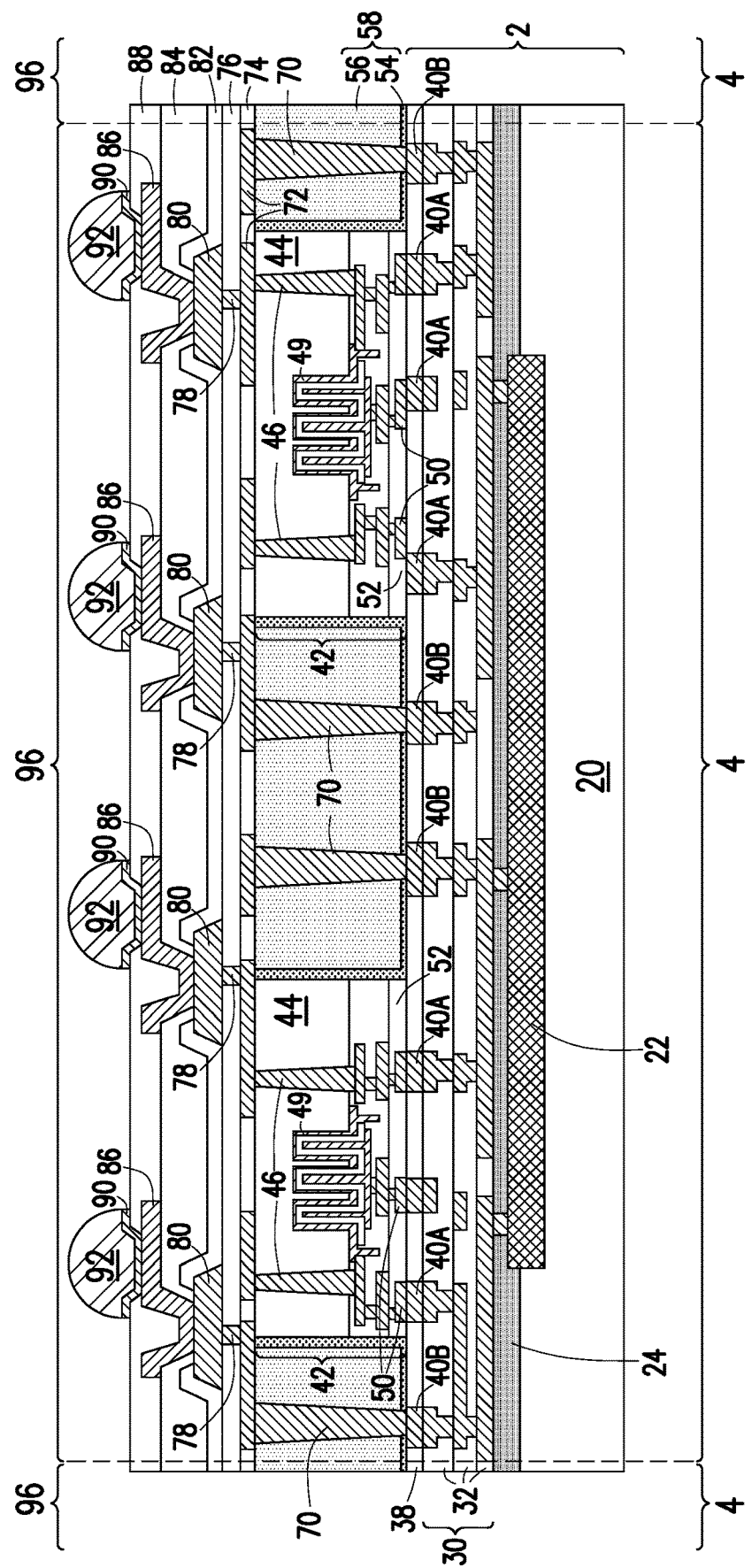

Referring to FIG. 12, Under-bump metallurgies (UBMs) 90 are formed, and UBMs 90 extend into polymer layer 88 to connect to PPIs 86. In accordance with some embodiments of the present disclosure, each of UBMs 90 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in UBMs 90.

As also shown in FIG. 12, electrical connectors 92 are formed. An example formation process for forming UBMs 90 and electrical connectors 92 includes depositing a blanket UBM layer, forming and patterning a mask (which may be a photo resist, not shown), with portions of the blanket UBM layer being exposed through the opening in the mask. After the formation of UBMs 90, the illustrated package is placed into a plating solution (not shown), and a plating process is performed to form electrical connectors 92 on UBMs 90. In accordance with some example embodiments of the present disclosure, electrical connectors 92 include non-solder parts (not shown), which are not molten in the subsequent reflow processes. The non-solder parts may be formed of copper, and hence are referred to as copper bumps hereinafter, although they may be formed of other non-solder materials. Electrical connectors 92 may further include solder caps, which may be formed of a Sn—Ag alloy, a Sn—Cu alloy, a Sn—Ag—Cu alloy, or the like, and may be lead-free or lead-containing.

The structure formed in preceding steps is referred to as reconstructed wafer 94. A die-saw (singulation) process is performed on reconstructed wafer 94 to separate reconstructed wafer 94 into a plurality of packages 96. The respective process is illustrated as process 218 in the process flow shown in FIG. 29.

In the resulting package, capacitor die 42 is bonded to a low-level dielectric layer and the respective bond pads in device die 4. For example, surface dielectric layer 38 may be immediately over and contacting the underlying low-k dielectric layer. Furthermore, the metal pads 40, RDLs 34, and vias 36 may all be formed through damascene processes, rather than deposition-and-etching. Metal pads 80, polymer layer 84, PPI 86, electrical connectors 92, or the like, which otherwise would be the upper features of device die 4, are formed after the bonding of capacitor die 42. Accordingly, capacitor die 42 is equivalent to be inserted between the lower layers and the upper layers of device die 4. The electrical paths between capacitors 49 and the power network inside the interconnect structure 30 in device die 4 is thus reduced. As a comparison, in conventional structures, upper features such as metal pads 80, polymer layer 84, PPI 86, electrical connectors 92, etc. will be formed before the bonding of capacitor dies 42, and capacitor dies 42 will be bonded over the upper features 80/84/86/92. The electrical paths between capacitors 49 and integrated circuit device 22 and the power network in device die 4 will be longer in conventional structures. The capacitors 49 are referred to as deep partition capacitors since these capacitors, instead of formed inside device die 4, are partitioned into another capacitor die, which is further inserted between dielectric layer 38 and the overlying features 80/84/86/92.

In accordance with some embodiments, throughout all of the embodiments of the present disclosure, each of the capacitors 49 in capacitor die 42 may have two terminals, each connected to one of bond pads 50. On the other hand, capacitors 49 may not be connected to any of through-vias 46 and any of through-vias 70. Furthermore, if capacitor die 42 includes active devices and/or memory devices (as will be discussed in subsequent embodiments), the capacitors 49 are also electrically disconnected from, and are not used by, the active devices and the memory devices in capacitor dies 42. Instead, capacitors 49 are used by device die 4.

Figure 13:
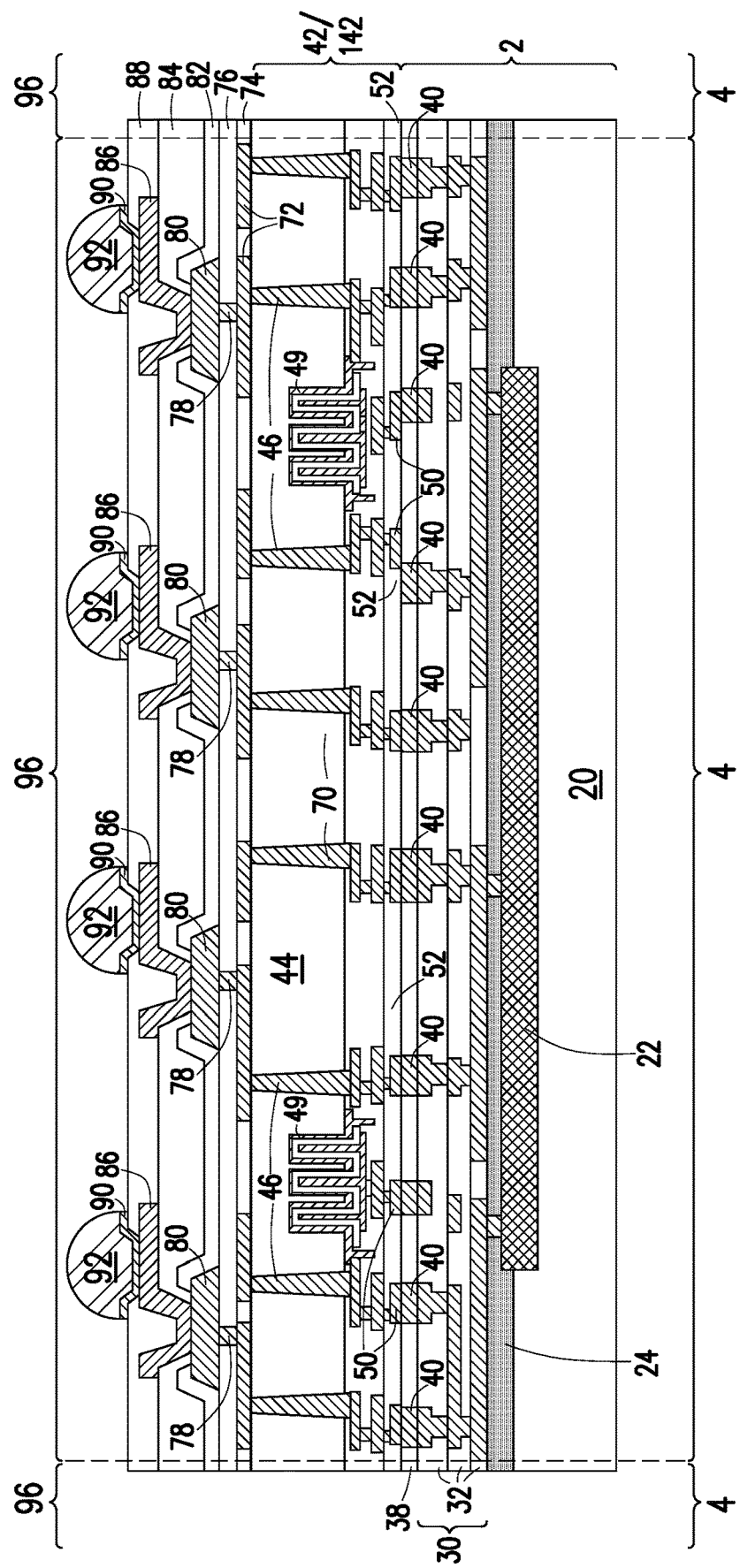
FIGS. 13 and 14 illustrate the cross-sectional views of the packages with deep partition capacitors in accordance with some embodiments.

FIG. 13 illustrates the reconstructed wafer 94 and packages 96 formed in accordance with alternative embodiments. These embodiments are similar to the embodiments shown in FIG. 12, except that instead of bonding discrete capacitor dies 42 to wafer 2, capacitor wafer 142 is bonded to wafer 2. Capacitor wafer 142 again includes a plurality of capacitor dies 42 therein. The processes and the materials for forming the corresponding reconstructed wafer 94 and packages 96 are essentially the same as the embodiments as shown in FIGS. 1-12, except in the embodiments in FIG. 13, wafer-to-wafer bonding is performed, and the gap-filling regions 58 and through-vias 70 (FIG. 12) are no longer formed.

Figure 14:
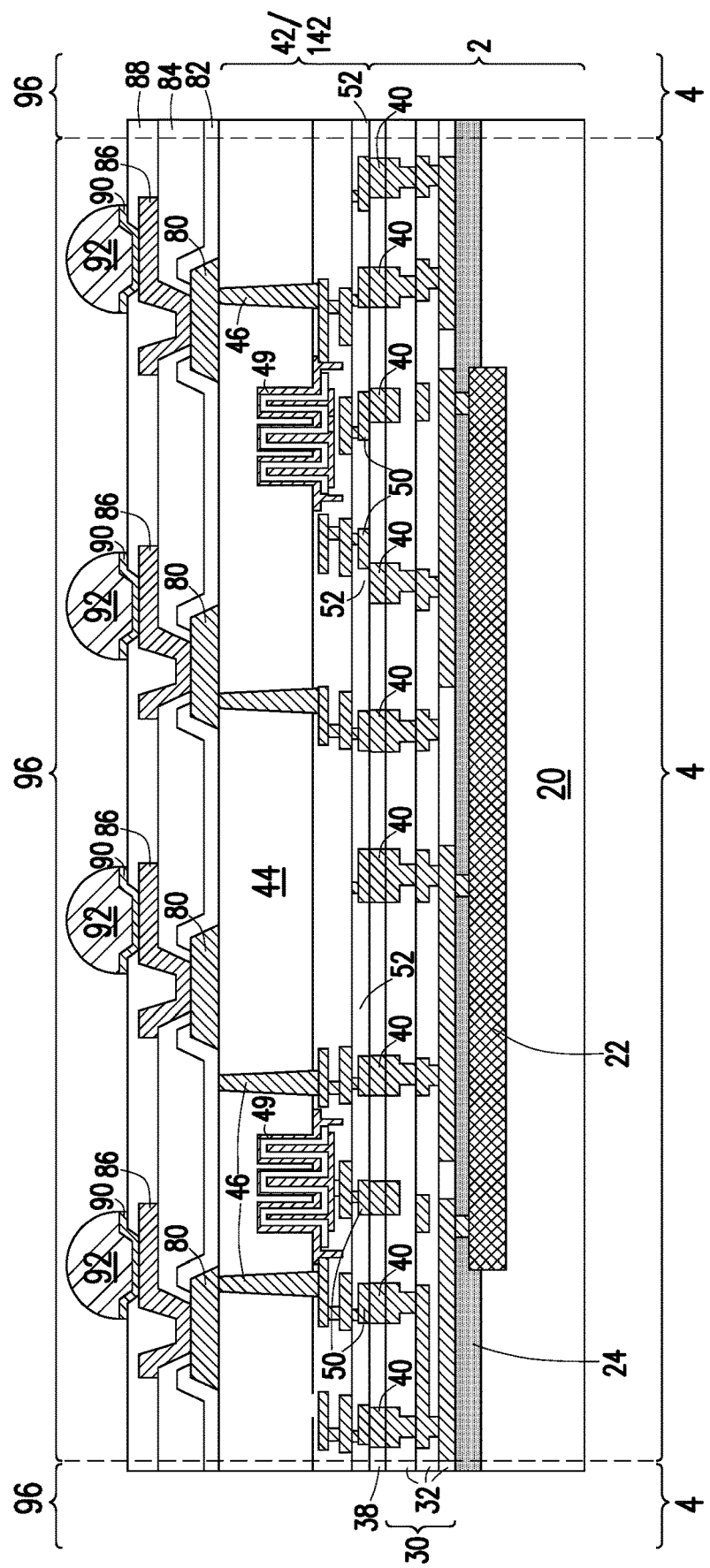

FIG. 14 illustrates the reconstructed wafer 94 and packages 96 formed in accordance with yet alternative embodiments. These embodiments are similar to the embodiments shown in FIG. 13, except that the additional redistribution layers such as redistribution lines 72 and the corresponding dielectric layers (such as 74) as shown in FIG. 13 are not formed. Rather, metal pads 80, which may be aluminum-containing pads, are formed directly on through-vias 46. The processes for forming the corresponding reconstructed wafer 94 and packages 96 are similar to the embodiments as shown in FIGS. 1-12, except some features are no longer formed.

FIGS. 15 through 20 illustrate the cross-sectional views of intermediate stages in the formation of a package including deep partition capacitors in accordance with some embodiments of the present disclosure. Unless specified otherwise, the materials and the formation processes of the components in these embodiments are essentially the same as the like components, which are denoted by like reference numerals in the preceding embodiments shown in FIGS. 1 through 12. The details regarding the formation process and the materials of the components shown in FIGS. 15 through 20 may thus be found in the discussion of the preceding embodiments.

Figure 15:
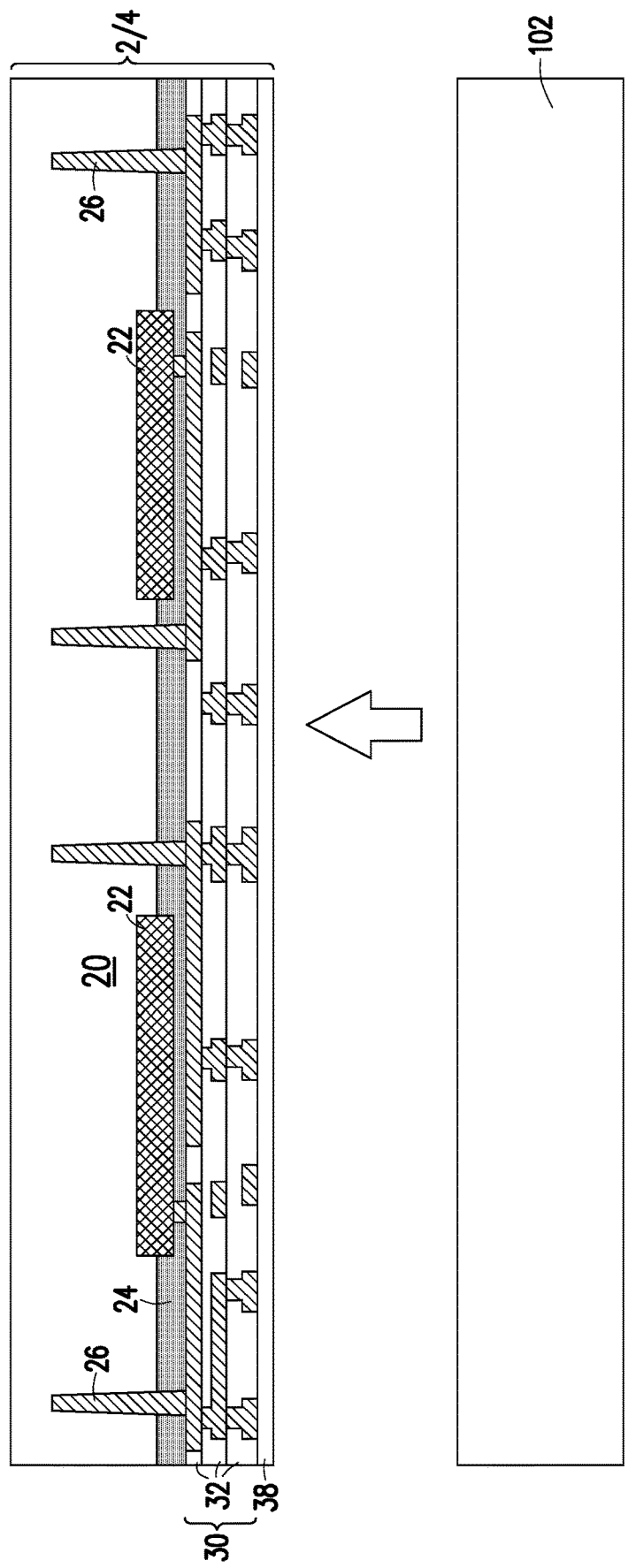
FIGS. 15-20 illustrate the cross-sectional views of intermediate stages in the formation of a package with deep partition capacitors on a supporting substrate in accordance with some embodiments.

Referring to FIG. 15, wafer 2 (and the corresponding device dies 4 therein) are bonded to a supporting substrate 102. Wafer 2 is essentially the same as the wafer 2 as shown in FIG. 1, except that through-vias 26 are formed extending into substrate 20. In accordance with some embodiments, supporting substrate 102 is a semiconductor substrate such as a silicon substrate. In accordance with alternative embodiments, supporting substrate 102 is a dielectric substrate such as a silicon oxide substrate, a silicon oxynitride substrate, or the like. The entire supporting substrate 102 may be formed of a homogeneous material, such as silicon, with no other materials such as metals therein. A silicon oxide layer may or may not be formed on the surface of supporting substrate 102. The bonding may be fusion bonding, with the surface dielectric layer 38 in wafer 2 being bonded to supporting substrate 102, for example, with Si—O—Si bonds being formed.

Figure 16:
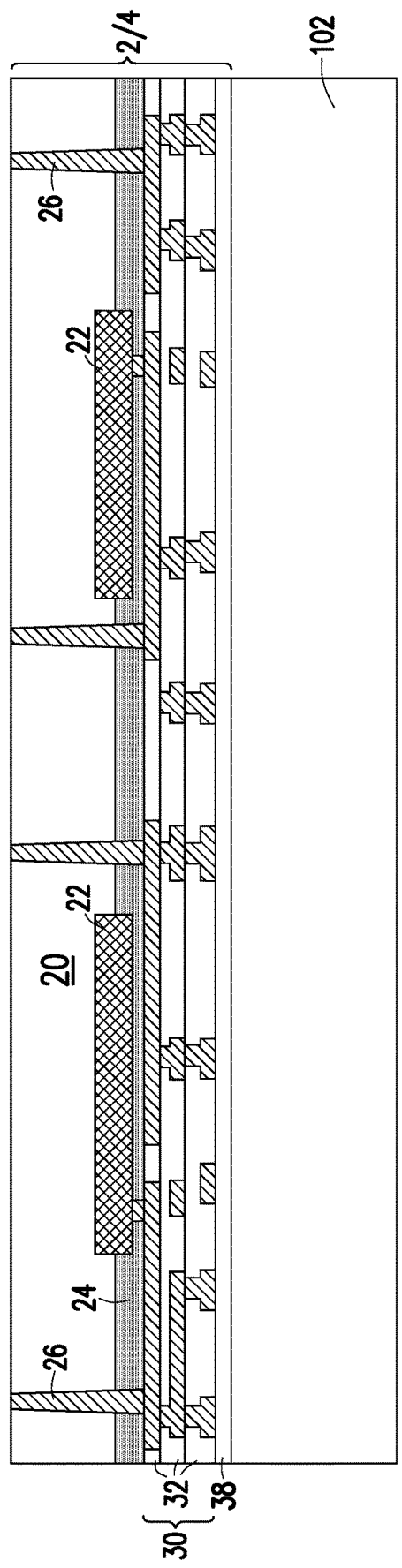
Figure 17:
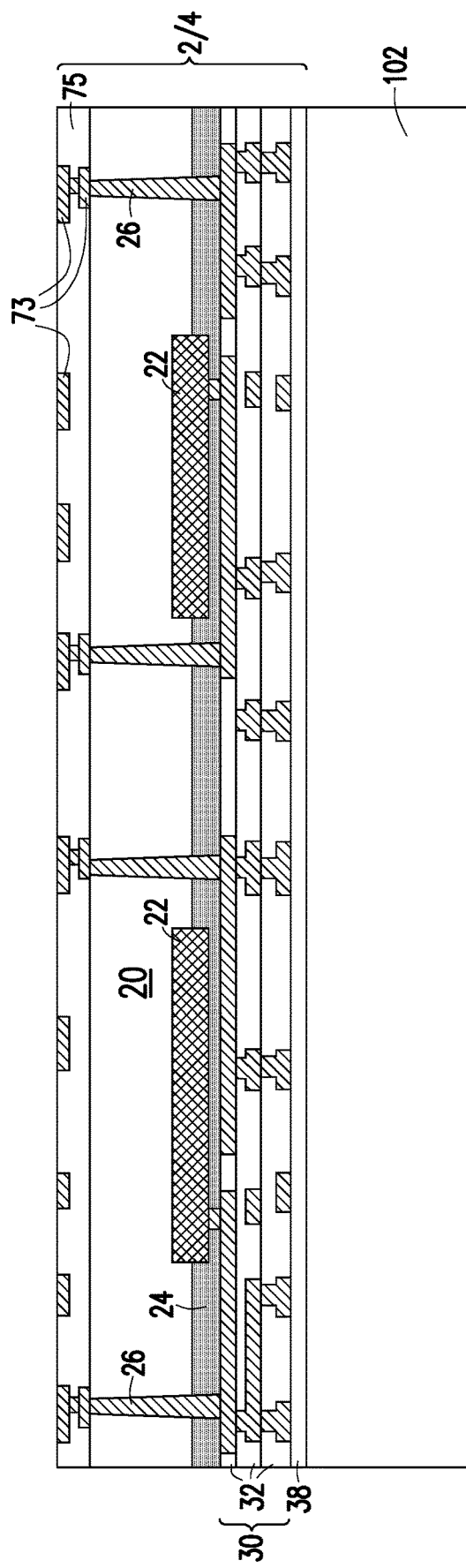

Referring to FIG. 16, a backside polishing process is performed on device wafer 2, until through-vias 26 are exposed. In a subsequent process, as shown in FIG. 17, backside RDLs 73 and dielectric layers 75 are formed to electrically couple to the front side interconnect structure 30, and to integrated circuit devices 22. Backside RDLs 73 may also be formed using damascene processes. Dielectric layers 75 may be formed of low-k and/or non-low-k dielectric materials. For example, a top dielectric layer 75 may be a non-low-k dielectric layer, while the underlying layers in dielectric layers 75 may be low-k dielectric layers. Backside RDLs 73 may be used to form a Power Distribution Network (PDN), which includes metal planes (plates) and vias for routing power such as VDD and VSS. In accordance with some embodiments, most (more than 50 percent) of the metal areas in backside RDLs 73 are used by the PDN, and a small portion of the metal areas are for signal routing. On the other hand, most of the signal routing are in the interconnect structure 30, which is on the front side of substrate 20. Although not shown in detail, the total thickness of dielectric layers 75 (and RDLs 73) is greater than the thickness of interconnect structure 30. With the total thickness of dielectric layers 75 (and RDLs 73) being greater than interconnect structure 30, PDN may be formed small voltage drop.

Figure 18:
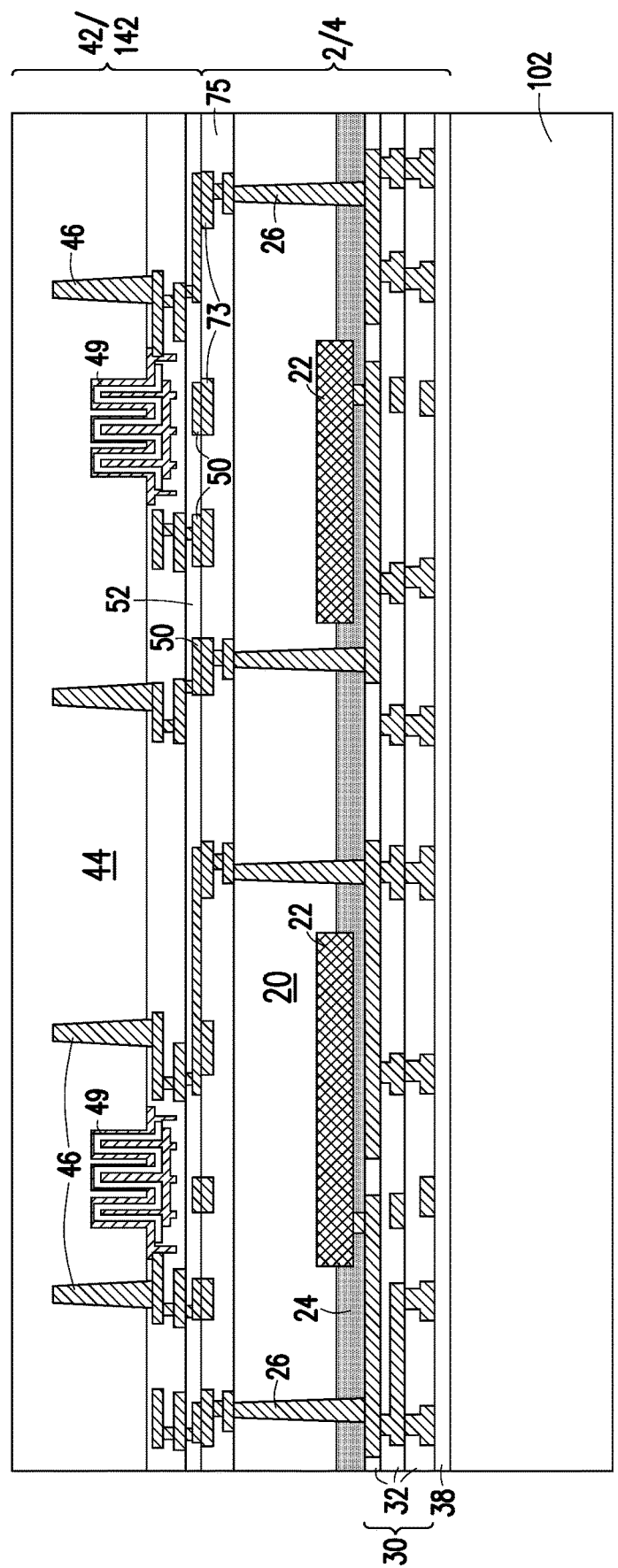

Next, as shown in FIG. 18, capacitor wafer 142, which includes capacitor dies 42 therein, is bonded to device wafer 2 through hybrid bonding. As discussed in detail in the preceding embodiments, capacitors 49 are formed in capacitor dies 42, and may be deep trench capacitors or other types of high-density capacitors such as multi-layer MIM capacitors. Capacitor dies 49 are electrically coupled to the bond pads. For example, each of capacitors 49 may have two terminals, each electrically connected to one of bond pads 50. Accordingly, after the bonding, each of the capacitors 49 is electrically connected to, and is used by, the devices in device dies 4.

Figure 19:
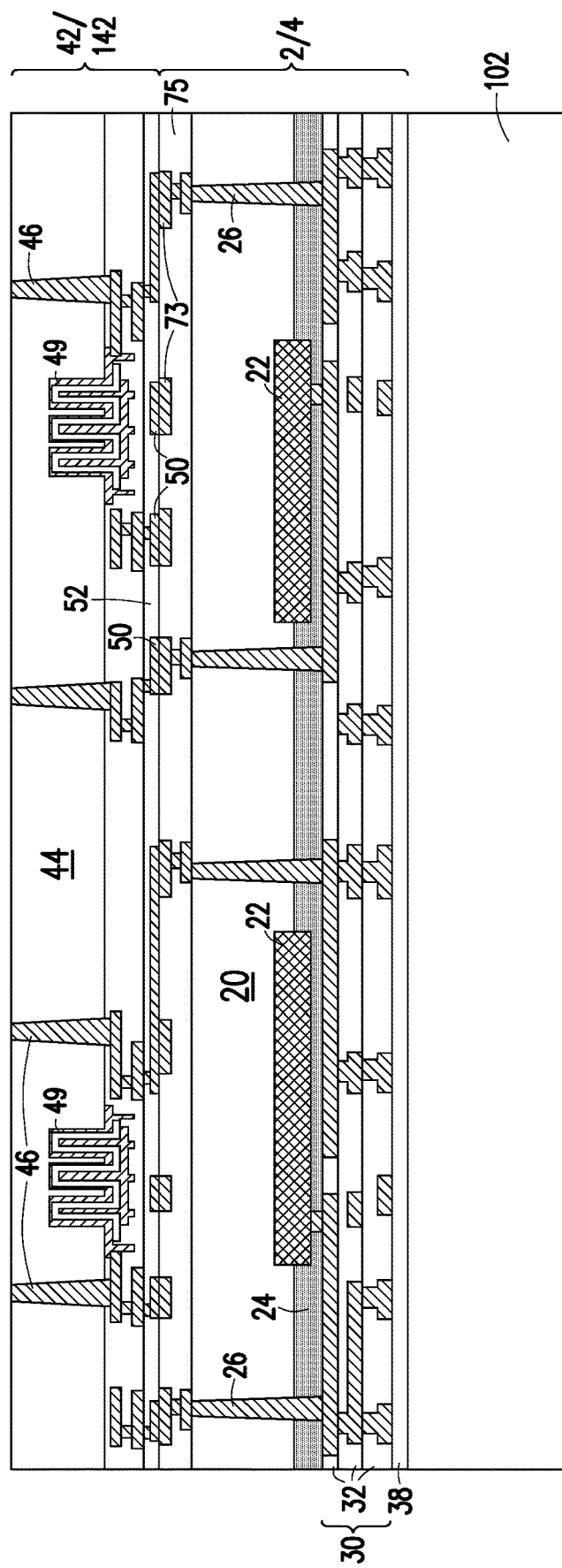
Figure 20:
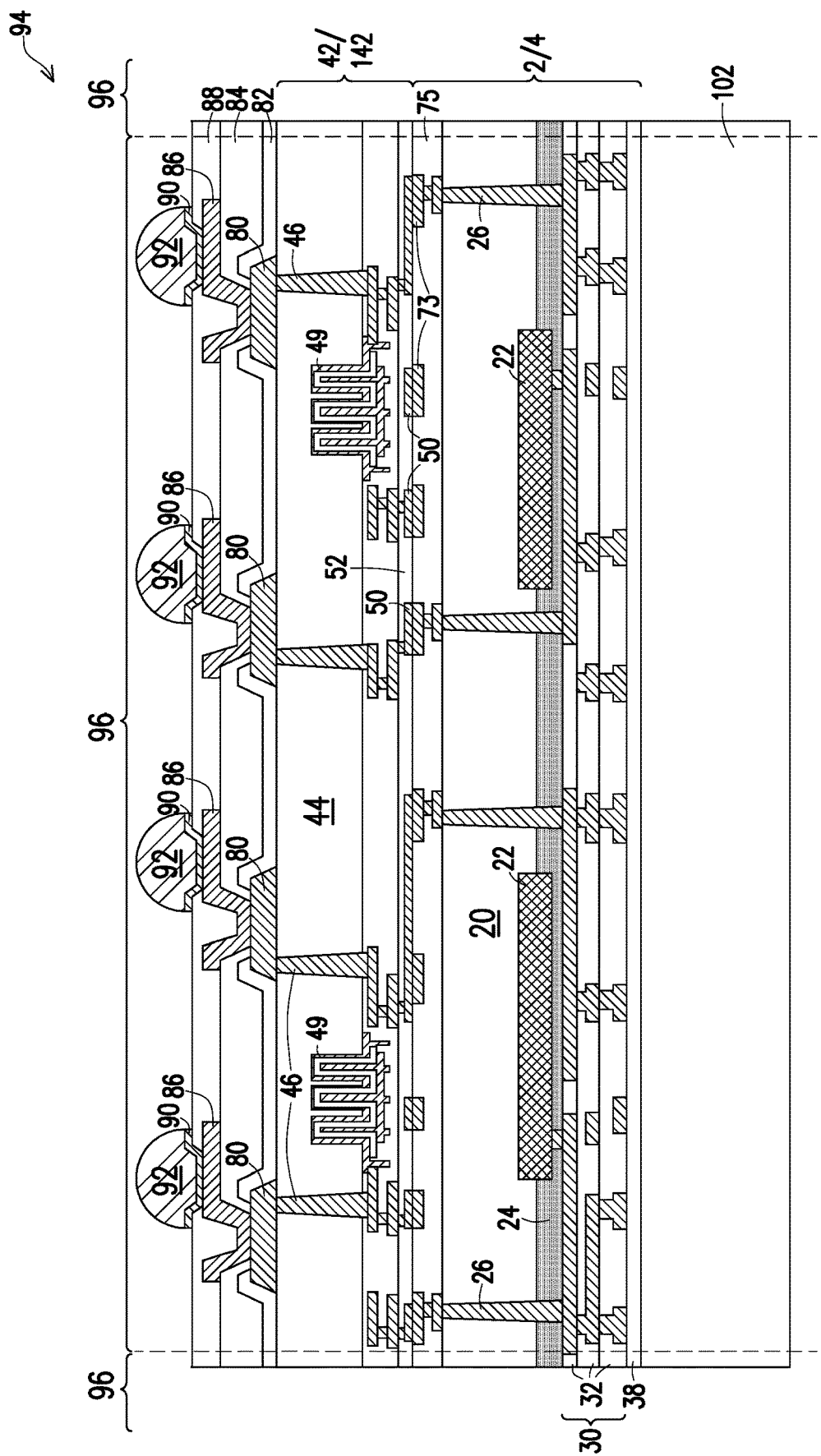

FIG. 19 illustrates a second planarization process, in which substrate 44 is polished, until through-vias 46 are exposed. Next, as shown in FIG. 20, metal pads 80 are formed in accordance with some embodiments to connect to through-vias 46. In accordance with alternative embodiments, more redistribution lines, which are similar to the redistribution lines 72 and dielectric layers 74 (FIG. 9), are formed on the backside of substrate 44, and the redistribution lines are connected to through-vias 46. The additional dielectric layers may also include low-k dielectric layers, and the corresponding RDLs may be formed using damascene processes.

In subsequent processes, overlying passivation layer 82, polymer layers 84 and 88, PPIs 86, UBMs 90, and electrical connectors 92 are formed. The details may be found referring to the embodiments shown in FIGS. 1-12, and are not repeated therein.

In the embodiments in FIG. 20, capacitor die 42 is bonded between devices 22 of the device die 4 and the overlying features 80/84/86/92, and hence the electrical paths between the capacitors 49 in capacitor dies 42 to integrated circuit devices 22 in device dies 4 are shortened.

Figure 21:
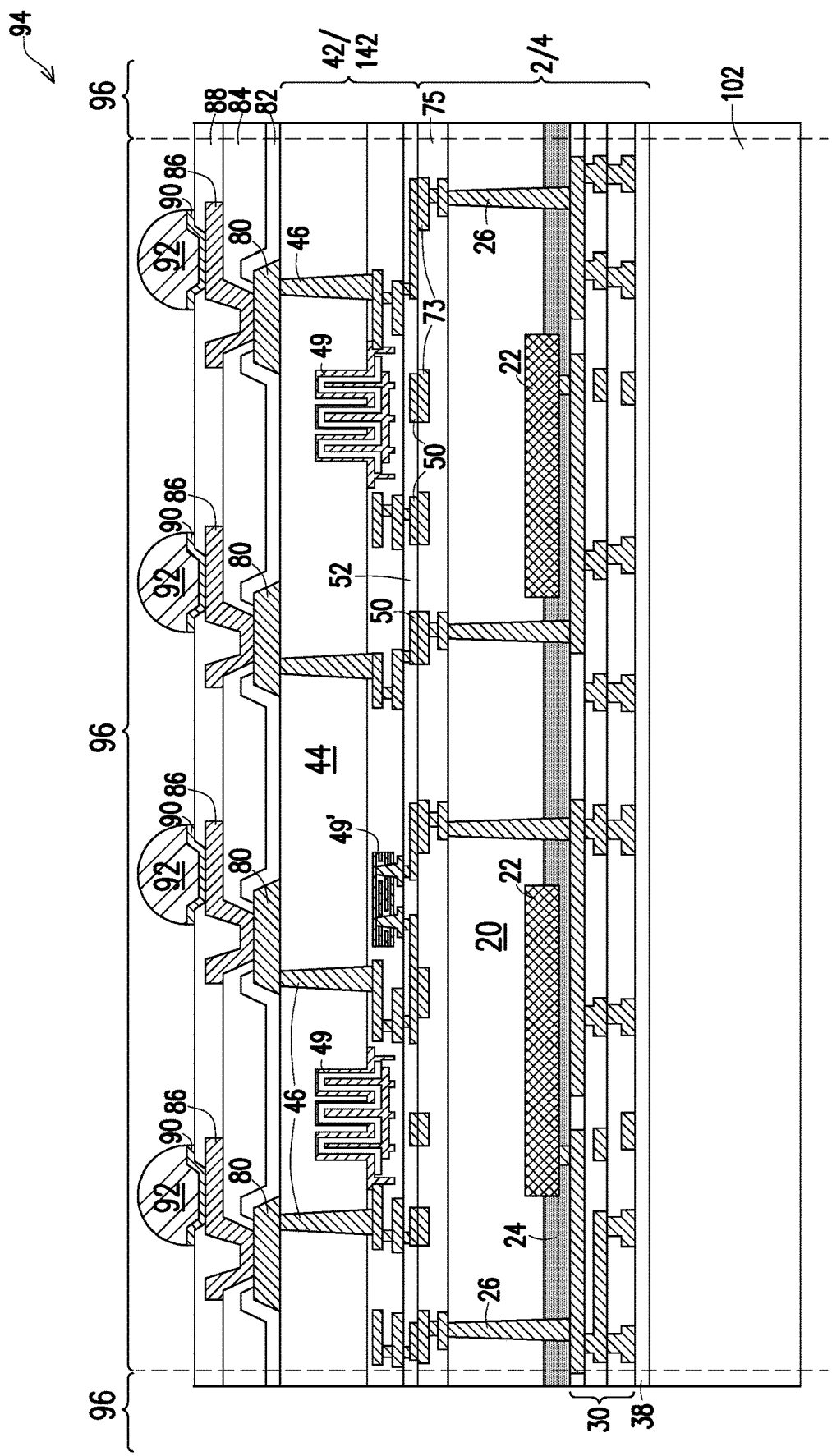
FIGS. 21-28 illustrate the cross-sectional views of the package with deep partition capacitors in accordance with some embodiments.

FIG. 21 illustrates the reconstructed wafer 94 and packages 96 formed in accordance with alternative embodiments. These embodiments are similar to the embodiments shown in FIG. 20, except that in addition to deep trench capacitors 49, MIM capacitors 49' are also formed on the front side of capacitor dies 4. MIM capacitors 49' are also connected to, and are used by, the integrated circuit devices 22 in device dies 4. Again, in packages 96, backside RDLs 73 in device dies 4 may be used to form a PDN, which includes metal plates and vias for routing power such as VDD and VSS. In accordance with some embodiments, most of the metal areas in backside RDLs 73 are used by the PDN, and a small portion of the metal areas are for signal routing. On the other hand, most of the signal routing are in the interconnect structure 30, which is on the front side of substrate 20. Although not shown in detail, the total thickness of dielectric layers 75 (and RDLs 73) may also be greater than the thickness of interconnect structure 30.

Figure 22:
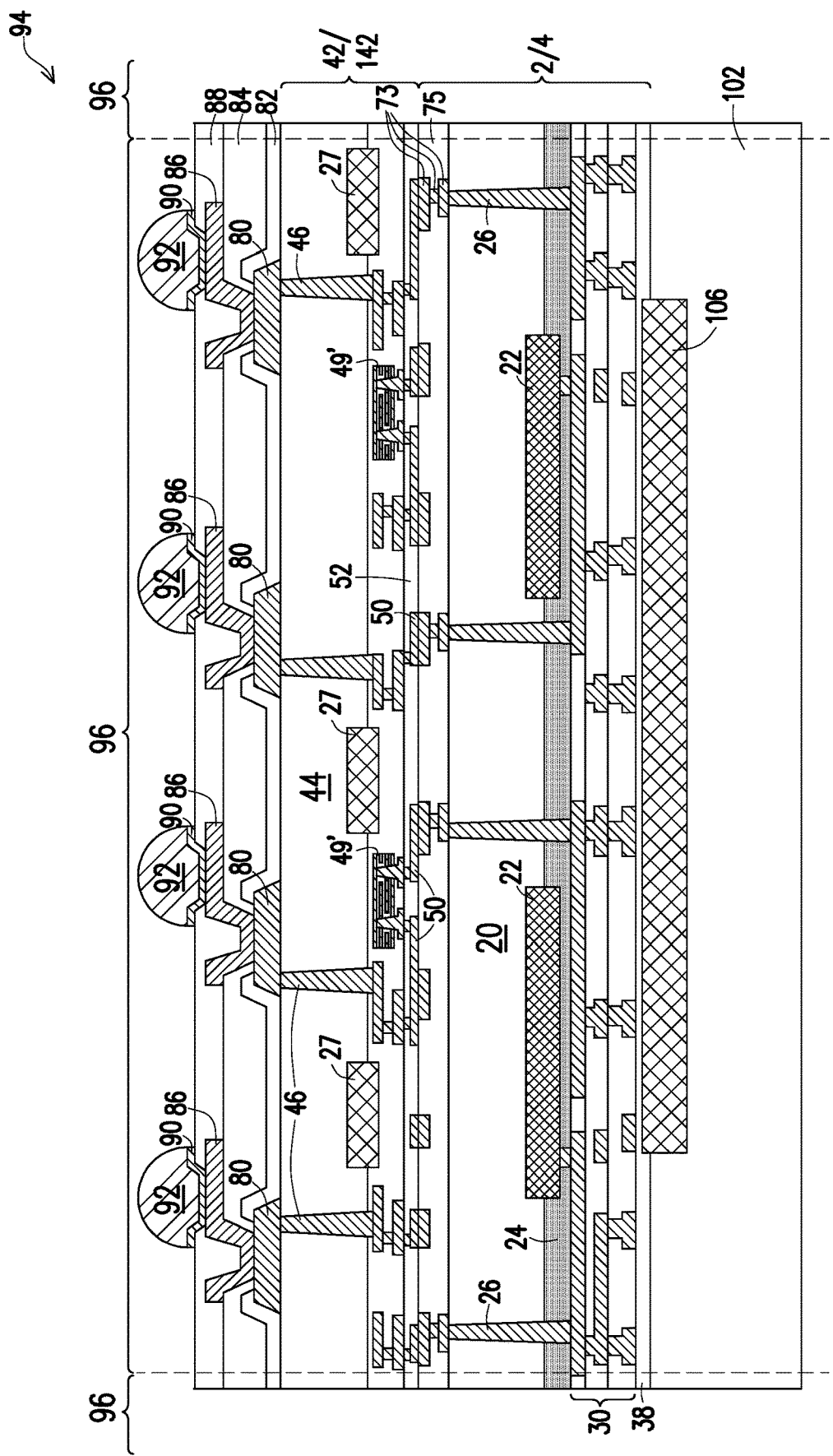

FIG. 22 illustrates the reconstructed wafer 94 and packages 96 formed in accordance with alternative embodiments. These embodiments are similar to the embodiments shown in FIG. 20, except that in addition to deep trench capacitors 49, MIM capacitors 49' are also formed in the front side of capacitor dies 4, and may include a plurality of layers so that the capacitance density is increased. Also, capacitor dies 42 include memory devices 27, which may be formed on the front surface (the illustrated bottom surface) of semiconductor substrate 44. The memory devices 27 may include Static Random Access Memory (SRAM), Dynamic Random Access Memory (DRAM), or other types of memories. There may not be deep trench capacitors in capacitor dies 42. Both of the memory devices 27 and MIM capacitors 49' are connected to and used by the integrated circuit devices 22 in device dies 4, and may not be connected to through-vias 46. In accordance with some embodiments, supporting substrate 102 is a blanket substrate, with an entirety being formed of a homogeneous material. In accordance with alternative embodiments, memory devices 106 are formed at the top surface of supporting substrate 102, and are electrically connected to, and are used by, the devices 22 in device die 4.

Figure 23:
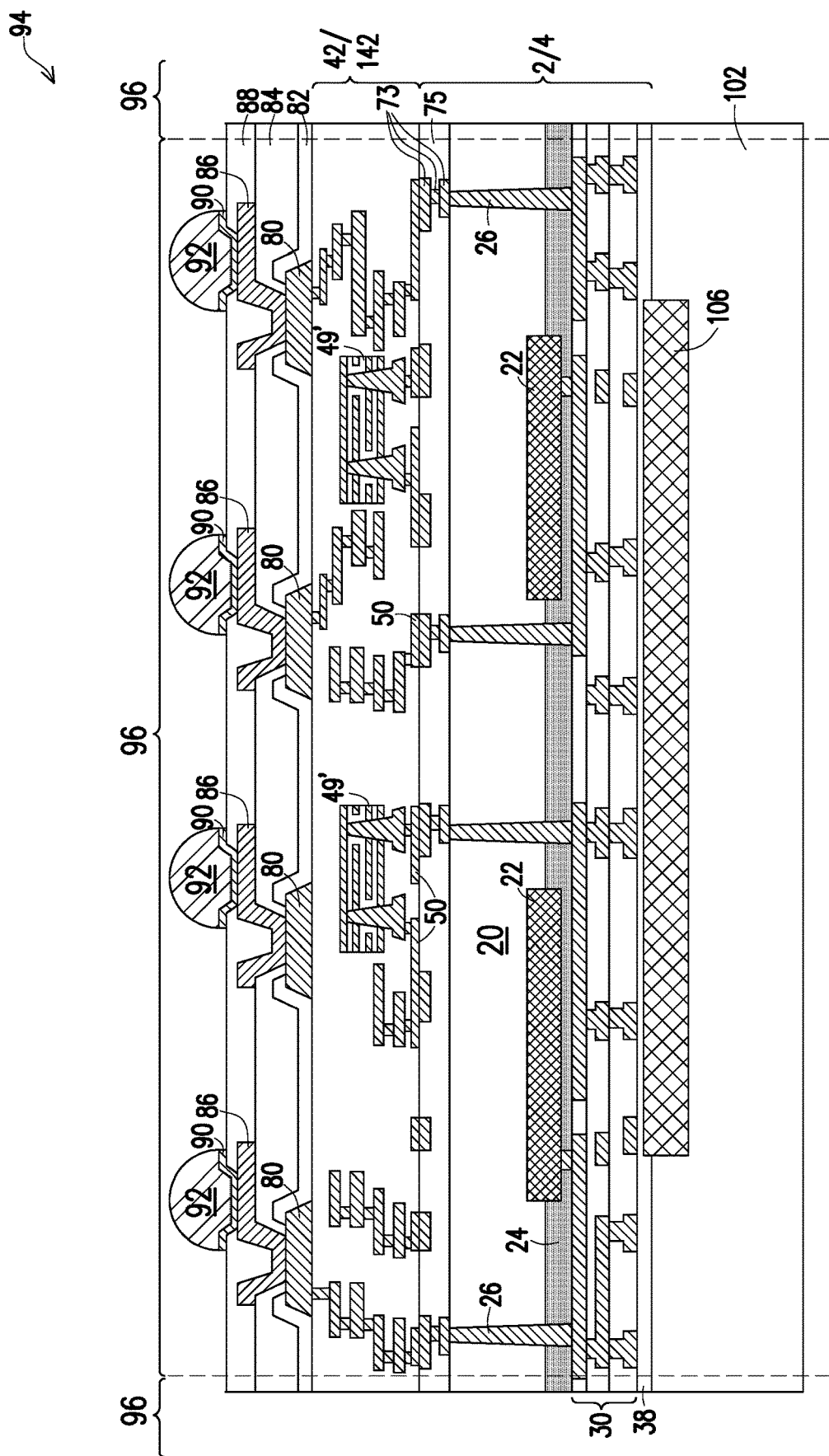

FIG. 23 illustrates the reconstructed wafer 94 and packages 96 formed in accordance with alternative embodiments. These embodiments are similar to the embodiments shown in FIG. 22, except that capacitor dies 42 do not include any semiconductor substrate, and MIM capacitors 49' are formed as a part of the redistribution structures in capacitor die 42. MIM capacitors 49' may include a plurality of layers so that the capacitance density is increased. In accordance with some embodiments, supporting substrate 102 is a blanket substrate, with an entirety being formed of a homogeneous material. In accordance with alternative embodiments, memory devices are formed at the surface of supporting substrate 102, and are electrically connected to, and are used by the devices 22 in device die 4. In accordance with alternative embodiments, memory devices 106 are formed at the top surface of supporting substrate 102, and are electrically connected to, and are used by, the devices 22 in device die 4.

Figure 24:
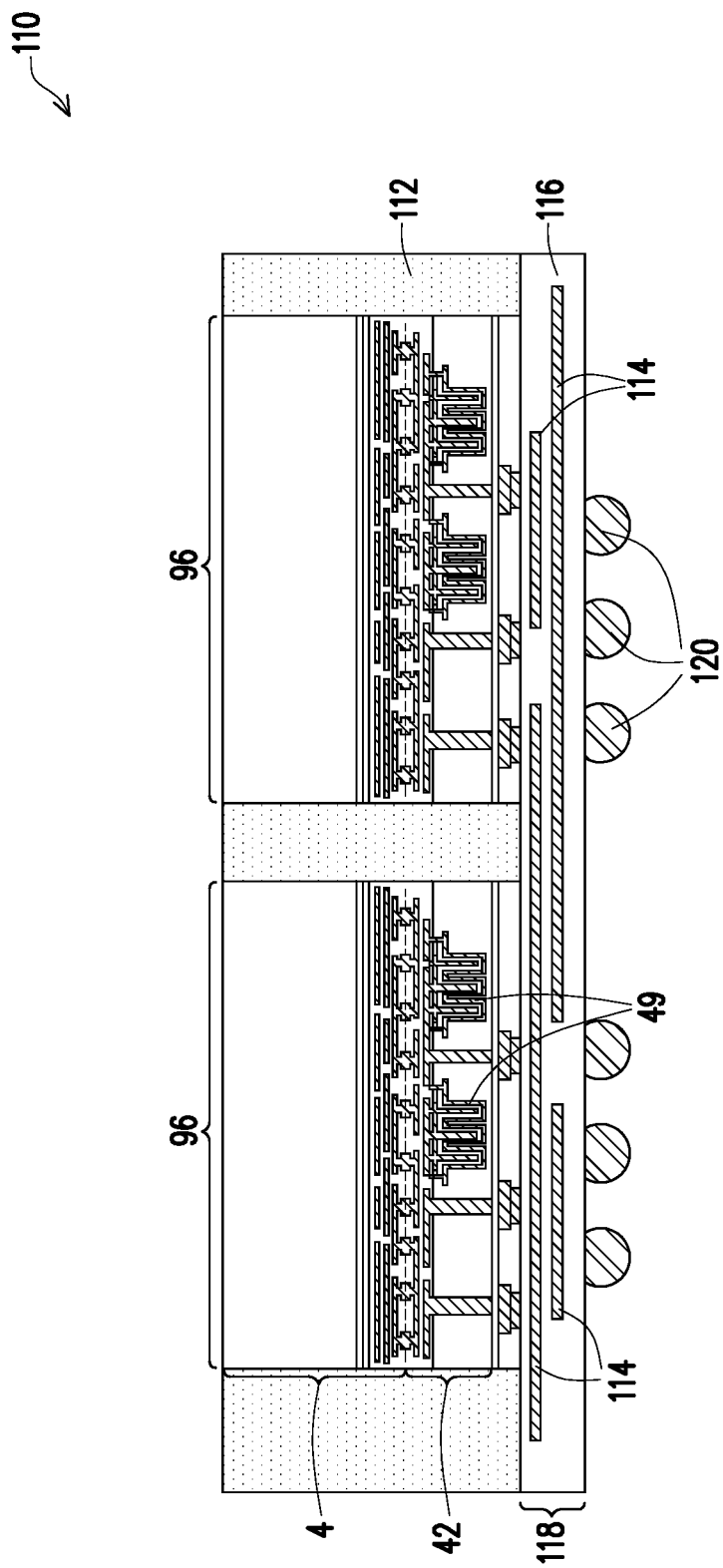

FIG. 24 illustrates a fan-out package 110 incorporating the packages 96 disclosed in preceding embodiments. The fan-out package includes packages 96 encapsulated in encapsulant 112. Encapsulant 112 may be a molding compound, a molding underfill, or the like. Fan-out redistribution structure 118, which includes RDLs 114 and dielectric layers 116, is formed on packages 96 and encapsulant 112. Electrical connectors 120 are formed on the surface of redistribution structure 118.

Figure 25:
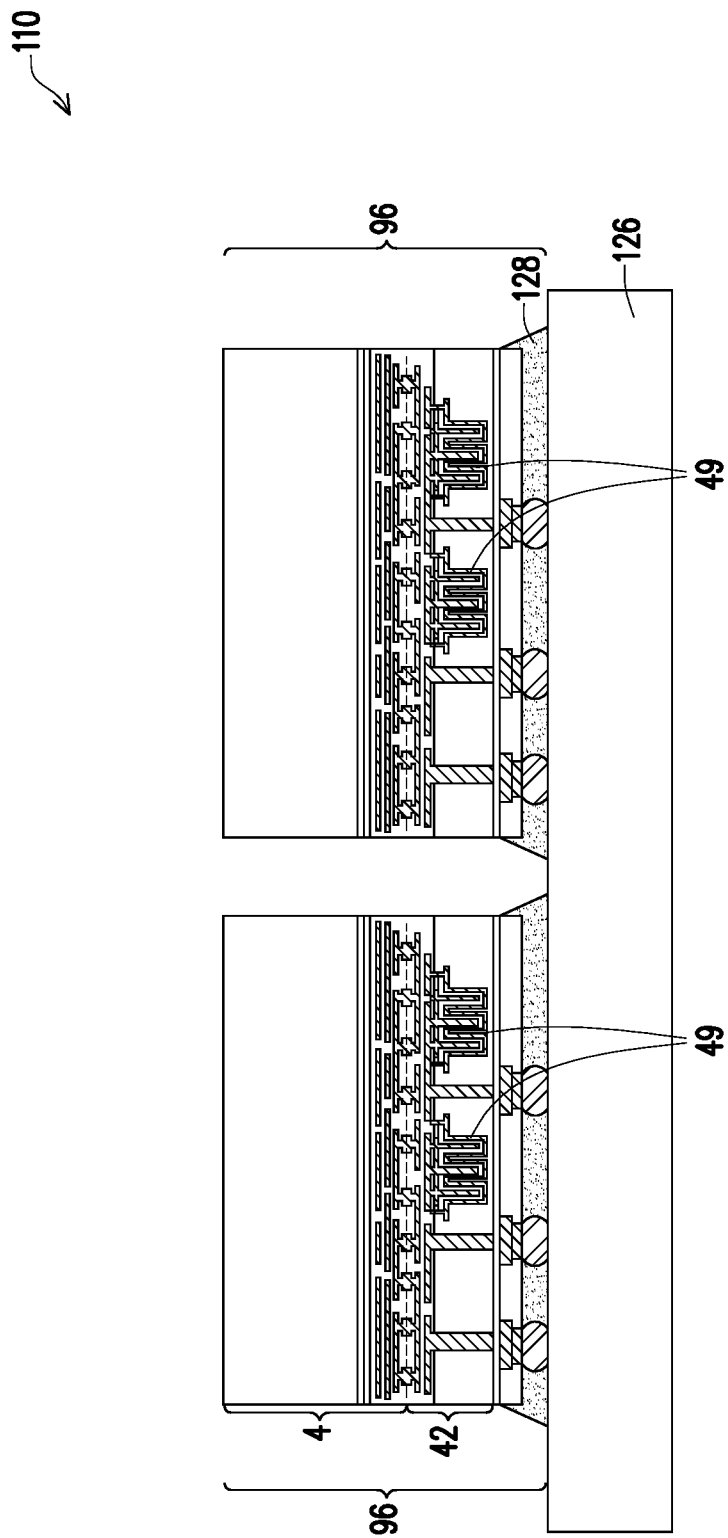

FIG. 25 illustrates a package no that includes the package 96 as disclosed in preceding embodiments. Packages 96 are bonded to package substrate 126 through flip-chip bonding. Underfill 128 is dispensed between packages 96 and package substrate 126.

Figure 26:
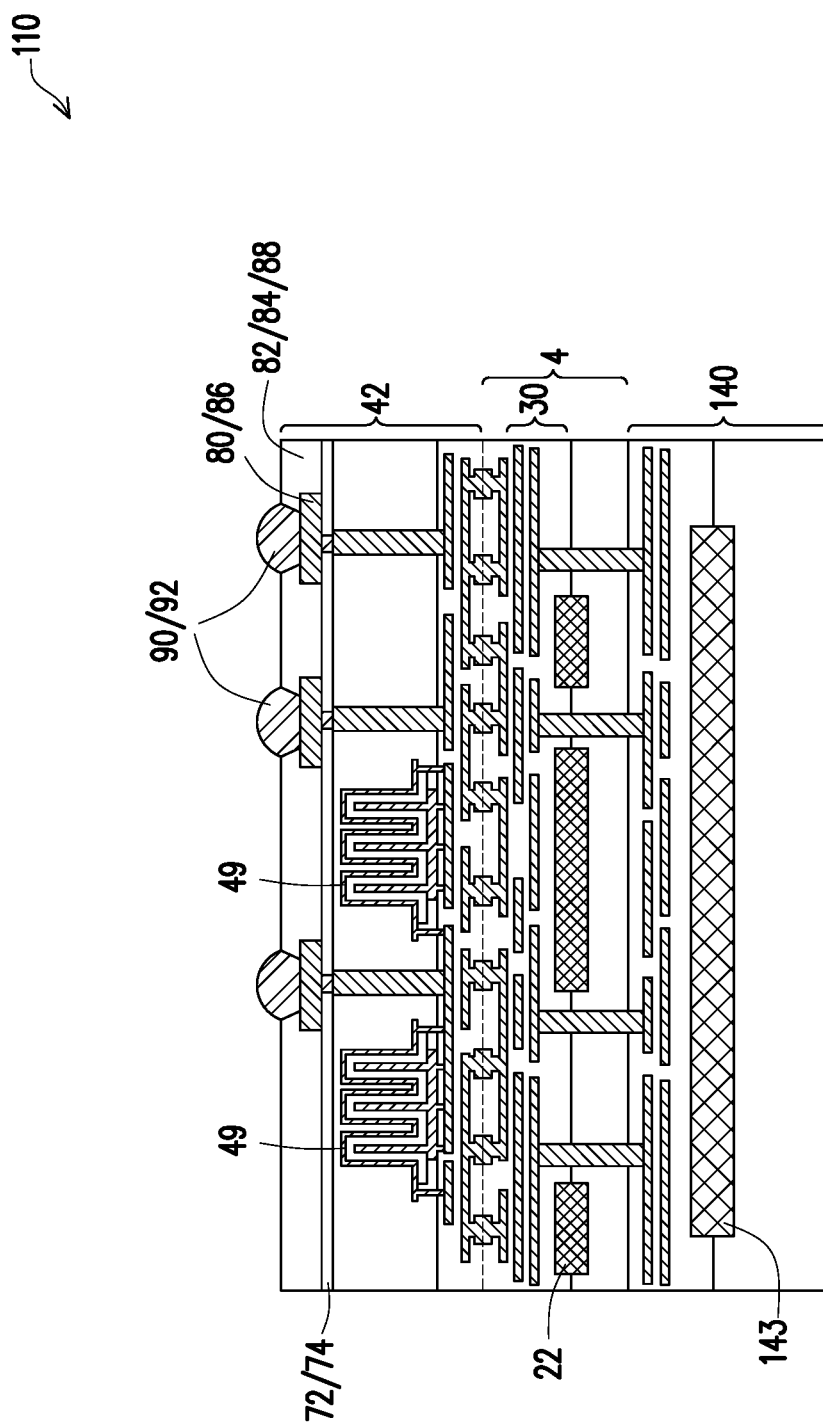

FIG. 26 illustrates a package no that includes the packages 96 formed in accordance with alternative embodiments. These embodiments are similar to the embodiments shown in FIG. 22, except that a memory die 140 is bonded to the backside of device die 4. Memory die 140 may include memories 143, which may include SRAM memories, DRAM memories, or the like. The front side of device die 4 in FIG. 26 faces up and faces toward capacitor die 42.

Figure 27:
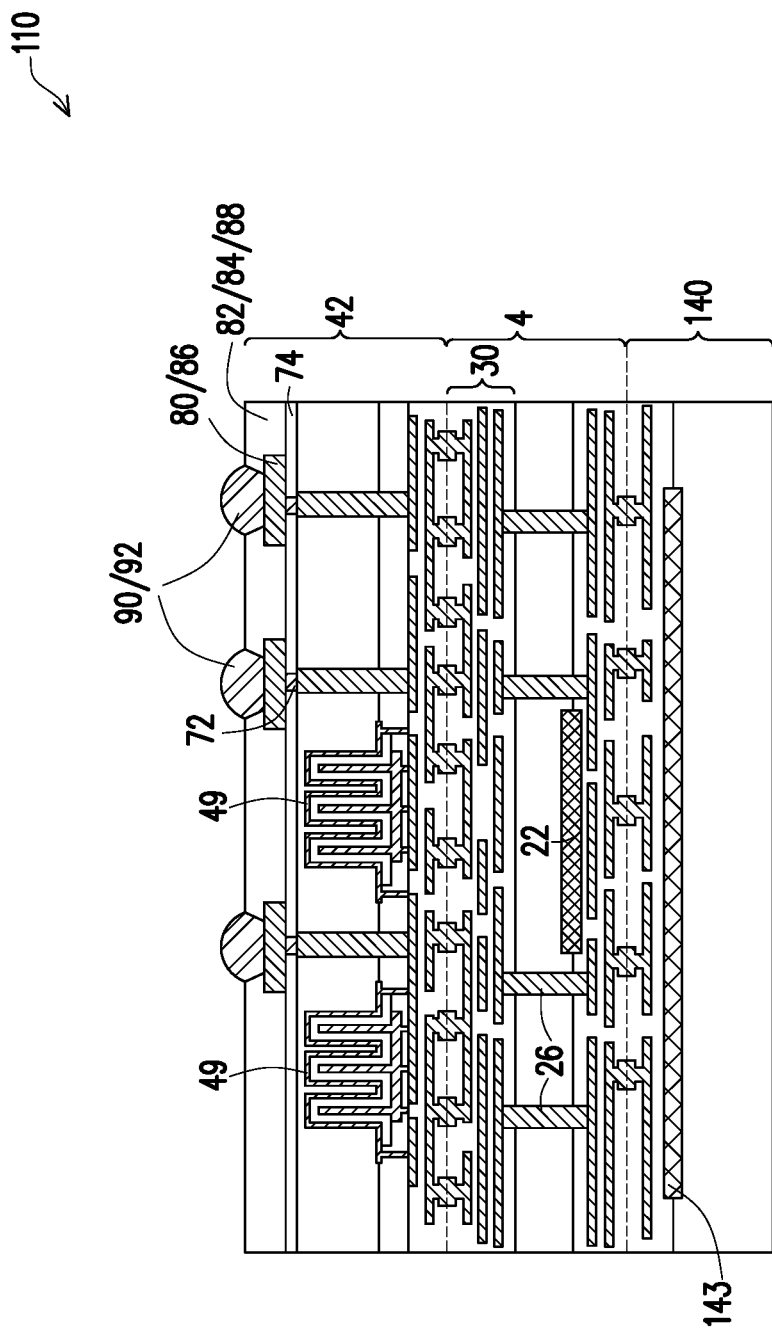

FIG. 27 illustrates a package no that includes the packages 96 formed in accordance with alternative embodiments. These embodiments may be formed by replacing the supporting substrate as in FIGS. 15-23 with a device die such as a memory die. The resulting structure is similar to the embodiments shown in FIG. 26, except that the front side of device die 4 in FIG. 27 faces down and faces away from capacitor die 42.

Figure 28:
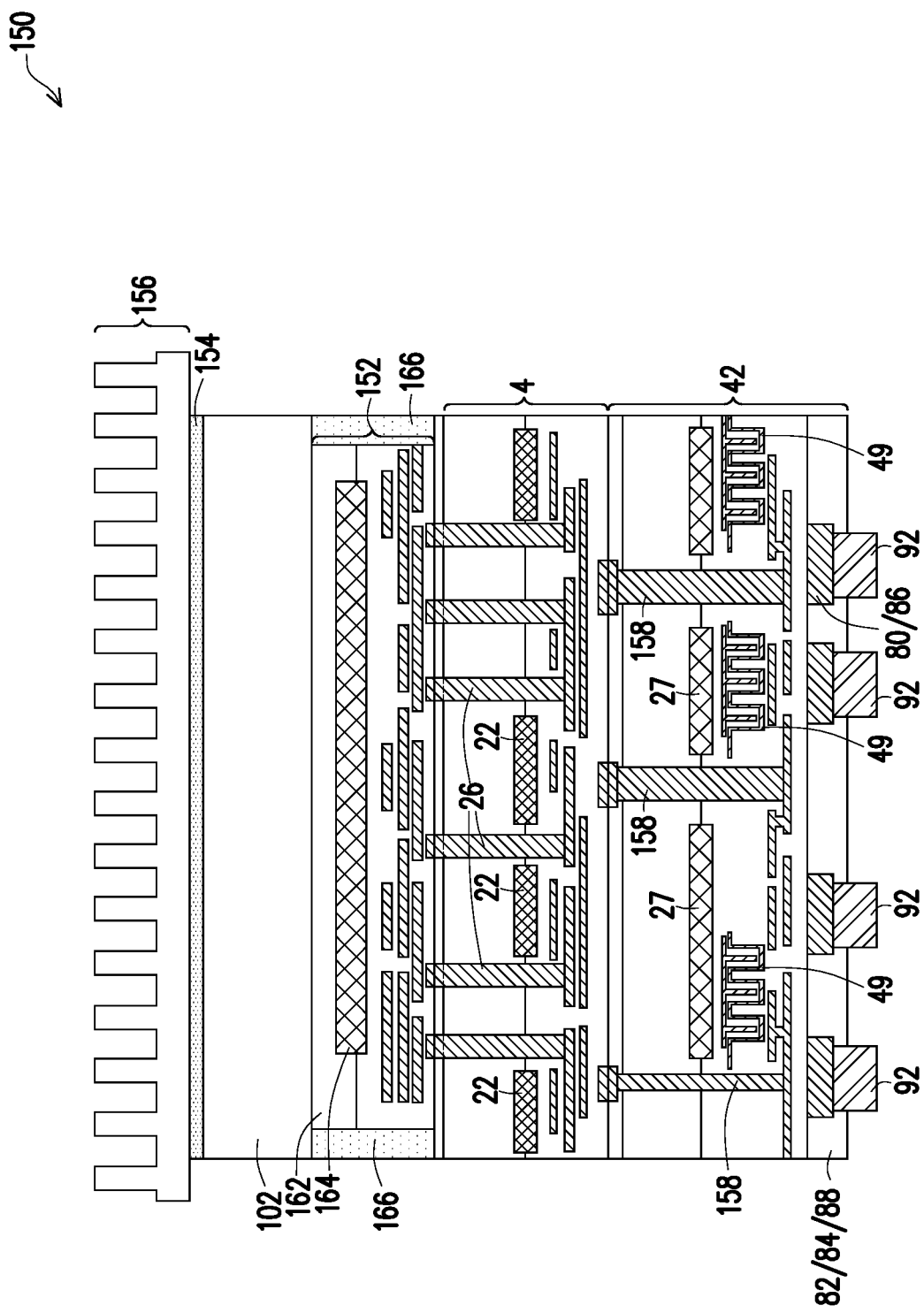

FIG. 28 illustrates a package 150, which includes device die 4 bonded with capacitor die 42. Capacitor die 42 includes capacitors 49, which may be deep trench capacitors in accordance with some embodiments. Furthermore, capacitor die 42 may include memory devices 27 therein. The through-vias 158 in capacitor die 42 may have different lateral dimensions.

Electrical connectors 92, layers 82/84/88, metal pads 80, and PPIs 86 are also illustrated. The package further includes memory die 152, which includes semiconductor substrate 162, and memory devices 164 formed on a surface of semiconductor substrate 162. Encapsulant 166, which may be a molding compound, is dispensed to encapsulate memory die 152 therein. Supporting die 102, which may be a blank die with an entirety being formed of a homogeneous material such as silicon, is further bonded to memory die 152. Thermal interface material 154 and heat spreader 156 are attached to supporting die 102. Supporting die 102 may be, or may not be adopted in different embodiments, and if supporting die 102 is not adopted, thermal interface material 154 will be in contact with the substrate 162. The sizes of dies 4, 42, and 152 may be equal to each other or different from each other, with the smaller dies surrounded by gap-filling materials such as oxides, nitrides, or the like. Furthermore, there may be more than one capacitor die 42, more than one memory die 152, etc., stacked together.

In each of the embodiments in FIGS. 21 through 28, capacitor die 42 is bonded between integrated circuit devices 22 of the device die 4 and the overlying features 80/84/86/92, and hence the electrical paths between the capacitors in capacitor dies to integrated circuit devices 22 in device dies 4 are short.

The embodiments of the present disclosure have some advantageous features. By forming high-density capacitors in a capacitor die, and bonding/inserting the high-density capacitors between the damascene structures of logic dies and the respective overlying features such as aluminum pads, polymer layers, or the like, high-density capacitors can be used, and the electrical paths between the high-density capacitors and the integrated circuits in logic dies such as CPU, GPU, XPU, or the like, are shortened.

In accordance with some embodiments of the present disclosure, a method comprises bonding a capacitor die to a device die, wherein the device die comprises a first semiconductor substrate; active devices at a surface of the first semiconductor substrate; a plurality of low-k dielectric layers; a first dielectric layer over and contacting a top low-k dielectric layer in the plurality of low-k dielectric layers; and a first plurality of bond pads in the first dielectric layer. The capacitor die comprises a second dielectric layer bonding to the first dielectric layer; a second plurality of bond pads in the second dielectric layer, wherein the second plurality of bond pads are bonded to the first plurality of bond pads; and a capacitor electrically coupled to the second plurality of bond pads; and after the capacitor die is bonded to the device die, forming an aluminum-containing pad over the capacitor die, wherein the aluminum-containing pad is electrically coupled to the device die; and forming a polymer layer over the aluminum-containing pad. In an embodiment, each of the device die and the capacitor die is free from polymer layers therein. In an embodiment, each of the device die and the capacitor die is free from aluminum-containing pads therein. In an embodiment, the capacitor die comprises a second semiconductor substrate, and the capacitor comprises a deep trench capacitor extending into the second semiconductor substrate. In an embodiment, the method further comprises, before the aluminum-containing pad is formed, forming gap-filling regions to encapsulate the capacitor die; and planarizing the gap-filling regions and the capacitor die. In an embodiment, the method further comprises bonding a supporting die to the device die; and polishing the device die to reveal through-vias in the device die, wherein the through-vias extend into the first semiconductor substrate. In an embodiment, the first dielectric layer and the first plurality of bond pads are formed on the polished device die. In an embodiment, the supporting die and the capacitor die are bonded to opposing sides of the device die. In an embodiment, the capacitor die is bonded to a front side of the device die. In an embodiment, the capacitor die is bonded to a backside of the device die. In an embodiment, the capacitor die is free from active devices therein. In an embodiment, the capacitor die is free from any semiconductor substrate therein. In an embodiment, the method further comprises forming a memory device in the capacitor die.

In accordance with some embodiments of the present disclosure, a package comprises a device die and a capacitor die. The device die comprises a semiconductor substrate; active devices at a surface of the semiconductor substrate; a plurality of low-k dielectric layers; a first dielectric layer over and contacting a top low-k dielectric layer in the plurality of low-k dielectric layers; and a first plurality of bond pads in the first dielectric layer. The capacitor die comprises a second dielectric layer bonding to the first dielectric layer; a second plurality of bond pads in the second dielectric layer, wherein the second plurality of bond pads are bonded to the first plurality of bond pads; and a capacitor electrically coupled to the second plurality of bond pads; and an aluminum-containing pad over the capacitor die, wherein the aluminum-containing pad is electrically coupled to the device die; and a polymer layer over the aluminum-containing pad. In an embodiment, each of the capacitor die and the device die is free from aluminum-containing pads. In an embodiment, each of the capacitor die and the device die is free from organic materials. In an embodiment, the package further comprises gap-filling regions encircling the capacitor die.

In accordance with some embodiments of the present disclosure, a package comprises a device die and a capacitor die. The device die comprises a first semiconductor substrate; a first plurality of dielectric layers; and a first plurality of damascene structures in the first plurality of dielectric layers, wherein top surfaces of the first plurality of damascene structures are coplanar with top surfaces of corresponding ones of the first plurality of dielectric layers. The capacitor die comprises a second semiconductor substrate; a second plurality of dielectric layers; and a second plurality of damascene structures in the second plurality of dielectric layers, wherein bottom surfaces of the second plurality of damascene structures are coplanar with bottom surfaces of corresponding ones of the second plurality of dielectric layers, wherein a bottom layer in the second plurality of dielectric layers is bonded to a top layer in the first plurality of dielectric layers; a plurality of aluminum-containing pads over the capacitor die, wherein the plurality of aluminum-containing pads are electrically coupled to the device die; a polymer layer comprising a portion covering an edge portion of each of the plurality of aluminum-containing pads; and a plurality of electrical connectors over and electrically connecting to the plurality of aluminum-containing pads. In an embodiment, all materials in the device die and the capacitor die are inorganic materials. In an embodiment, the capacitor die comprises a deep trench capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a device die comprising:
a plurality of low-k dielectric layers;
dual damascene structures in the plurality of low-k dielectric layers, wherein the dual damascene structures comprise metal lines and vias under the metal lines;
a first non-low-k dielectric layer over and contacting a top low-k dielectric layer of the plurality of low-k dielectric layers; and
a first bond pad and a second bond pad in the first non-low-k dielectric layer;
a capacitor die comprising:
a capacitor;
a second non-low-k dielectric layer; and
a third bond pad and a fourth bond pad in the second non-low-k dielectric layer and electrically connecting to two terminals of the capacitor, wherein the third bond pad and the fourth bond pad are bonded to the first bond pad and the second bond pad, respectively;
a plurality of aluminum-containing pads over the capacitor die, wherein the plurality of aluminum-containing pads are electrically coupled to the device die; and
a polymer layer over the aluminum-containing pad.

2. The structure of claim 1 further comprising:
a gap-filling region, with the capacitor die being in the gap-filling region; and
a through-via in the gap-filling region, wherein the through-via electrically connects one of the plurality of aluminum-containing pads to the device die.

3. The structure of claim 2, wherein the capacitor die is bonded to a front side of the device die.

4. The structure of claim 1, wherein edges of the capacitor die are vertically aligned to respective edges of the device die.

5. The structure of claim 4 further comprising:
a supporting die bonding to the device die, wherein the capacitor die and the supporting die are on opposite sides of the device die, and the supporting die is a blank die.

6. The structure of claim 4, wherein the capacitor die is bonded to a backside of the device die.

7. The structure of claim 1, wherein the capacitor die further comprises:
a semiconductor substrate; and
a through-via penetrating through the semiconductor substrate, wherein the through-via electrically connects one of the plurality of aluminum-containing pads to the device die.

8. The structure of claim 1, wherein both of the device die and the capacitor die are free from polymer layers therein.

9. The structure of claim 1, wherein both of the device die and the capacitor die are free from aluminum-containing pads therein.

10. The structure of claim 1, wherein the capacitor die comprises a semiconductor substrate, and wherein the capacitor comprises a deep trench capacitor extending into the semiconductor substrate.

11. A structure comprising:
a device die comprising:
a semiconductor substrate;
active devices at a surface of the semiconductor substrate;
a plurality of dielectric layers;
a plurality of dual damascene structures in the plurality of dielectric layers; and
a first plurality of bond pads over and contacting top ones of the plurality of dual damascene structures;
a capacitor die free from active devices therein, wherein the capacitor die comprises:
a second plurality of bond pads bonding to the first plurality of bond pads; and
a capacitor electrically coupled to two of the second plurality of bond pads; and
a conductive feature over the capacitor die, wherein the conductive feature is electrically coupled to the device die, and wherein the structure is free from polymers between the conductive feature and the semiconductor substrate of the device die.

12. The structure of claim 11, wherein each of the capacitor die and the device die is free from aluminum-containing pads.

13. The structure of claim 11 further comprising a non-low-k dielectric layer over and contacting the plurality of dielectric layers, with the first plurality of bond pads being in the non-low-k dielectric layer, wherein the plurality of dielectric layers comprise low-k dielectric materials.

14. The structure of claim 11, wherein the capacitor die further comprises a first through-via and a second through-via electrically connecting to the two of the second plurality of bond pads, and electrically connect the two of the second plurality of bond pads to top surface conductive features of the capacitor die.

15. The structure of claim 11 further comprising gap-filling regions encircling the capacitor die, wherein the gap-filling regions overlap the device die.

16. The structure of claim 11, wherein first edges of the capacitor die are vertically aligned to second vertical edges of the device die.

17. A package comprising:
a device die comprising:
a first semiconductor substrate;
a first plurality of dielectric layers over the first semiconductor substrate; and
a first plurality of damascene structures in the first plurality of dielectric layers, wherein the first plurality of damascene structures comprise:
first dual damascene structures; and
first single damascene structures over and contacting the first dual damascene structures;
a capacitor die comprising:
a second semiconductor substrate;
a second plurality of dielectric layers under the second semiconductor substrate; and
a second plurality of damascene structures in the second plurality of dielectric layers, wherein the second plurality of damascene structures comprise:
second dual damascene structures; and
second single damascene structures under and contacting the second dual damascene structures, wherein the second single damascene structures are bonded to respective ones of the first single damascene structures; and
a plurality of electrical connectors over and electrically connecting to the device die through the capacitor die.

18. The package of claim 17, wherein the first dual damascene structures are in first low-k dielectric layers of the first plurality of dielectric layers, the second dual damascene structures are in second low-k dielectric layers of the second plurality of dielectric layers.

19. The package of claim 18, wherein the first single damascene structures are in a first non-low-k dielectric layer of the first plurality of dielectric layers, the second single damascene structures are in a second non-low-k dielectric layer of the second plurality of dielectric layers.

20. The package of claim 17, wherein both of the capacitor die and the device die are free from polymer layers.

\* \* \* \* \*